United States Patent
Jeong et al.

(10) Patent No.: US 11,632,881 B2
(45) Date of Patent: Apr. 18, 2023

(54) METHOD FOR CONTROLLING COOLING FAN AND WIRELESS CHARGING DEVICE

(71) Applicant: SAMSUNG ELECTRONICS CO., LTD., Suwon-si (KR)

(72) Inventors: Chihwan Jeong, Suwon-si (KR); Kyungha Koo, Suwon-si (KR); Jihong Kim, Suwon-si (KR); Dongku Kang, Suwon-si (KR); Kuntak Kim, Suwon-si (KR); Yunjeong Park, Suwon-si (KR); Kyuhwan Lee, Suwon-si (KR); Haejin Lee, Suwon-si (KR); Seyoung Jang, Suwon-si (KR); Hyuntae Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 16/952,595

(22) Filed: Nov. 19, 2020

(65) Prior Publication Data
US 2021/0161034 A1    May 27, 2021

(30) Foreign Application Priority Data
Nov. 25, 2019    (KR) .................. 10-2019-0152255

(51) Int. Cl.
*H05K 7/20* (2006.01)
*H02J 7/02* (2016.01)
(Continued)

(52) U.S. Cl.
CPC ........ *H05K 7/20909* (2013.01); *H02J 7/0044* (2013.01); *H02J 7/02* (2013.01); *H02J 50/10* (2016.02); *H05K 7/20945* (2013.01)

(58) Field of Classification Search
CPC . H05K 7/20909; H05K 7/20945; H02J 50/10; H02J 7/0044; H02J 7/02
See application file for complete search history.

(56) References Cited

U.S. PATENT DOCUMENTS 7,458,767 B2   12/2008   Wu et al.
8,063,519 B2   11/2011   Smith
(Continued)

FOREIGN PATENT DOCUMENTS

CN    108551193    9/2018
EP    3361597      8/2018
(Continued)

OTHER PUBLICATIONS

International Search Report and Written Opinion dated Mar. 22, 2021 in corresponding International Application No. PCT/KR2020/016383.

*Primary Examiner* — Mukundbhai G Patel
(74) *Attorney, Agent, or Firm* — Nixon & Vanderhye, P.C.

(57) ABSTRACT

The disclosure relates to a wireless charging device including a cooling fan, and the wireless charging device according to an embodiment of the disclosure includes: a housing including a holding portion configured to hold an external electronic device; a first bracket positioned in the holding portion; a conductive coil disposed in the first bracket; a second bracket positioned in the holding portion and including a penetrating hole; a first cooling fan positioned in the penetrating hole; a second cooling fan positioned in the penetrating hole and spaced apart from the first cooling fan; and a partition formed in the penetrating hole to isolate the first cooling fan and the second cooling fan from each other, the penetrating hole being divided into a first area having the first cooling fan disposed therein and a second area having the second cooling fan positioned therein, at least one protrusion having a volute shape formed on at least a portion of the second bracket or at least a portion of the partition, a first opening formed on at least an area of the first bracket to allow air cooled by the first cooling fan and/or the second cooling fan to move to the holding portion, and a second (Continued)

opening formed on at least an area of the holding portion to allow the air transmitted from the first opening to move outside the wireless charging device.

19 Claims, 16 Drawing Sheets

(51) Int. Cl.
*H02J 50/10* (2016.01)
*H02J 7/00* (2006.01)

(56) References Cited

U.S. PATENT DOCUMENTS

| | | | |
|---|---|---|---|
| 2011/0167845 | A1 | 7/2011 | Lee et al. |
| 2018/0181171 | A1 | 6/2018 | Jang et al. |
| 2018/0288898 | A1* | 10/2018 | Jeong .................... H02J 7/0044 |
| 2019/0052104 | A1* | 2/2019 | Schlachte ............... H01T 23/00 |
| 2019/0223329 | A1 | 7/2019 | Moon et al. |
| 2020/0091755 | A1* | 3/2020 | Larsson .............. H01F 27/2876 |
| 2020/0358301 | A1 | 11/2020 | Kim |

FOREIGN PATENT DOCUMENTS

| | | |
|---|---|---|
| KR | 10-2018-0074377 | 7/2018 |
| KR | 10-1879656 | 7/2018 |
| KR | 10-1918229 | 11/2018 |

* cited by examiner

METHOD FOR CONTROLLING COOLING FAN AND WIRELESS CHARGING DEVICE

CROSS-REFERENCE TO RELATED APPLICATION

This application is based on and claims priority under 35 U.S.C. § 119 to Korean Patent Application No. 10-2019-0152255, filed on Nov. 25, 2019, in the Korean Intellectual Property Office, the disclosure of which is incorporated by reference herein in its entirety.

BACKGROUND

Field

The disclosure relates to a method for controlling a cooling fan and a wireless charging device.

Description of Related Art

As electronic devices (for example, smartphones, wearable electronic devices) are developing, technology of peripherals for electronic devices are rapidly developing.

To supply power to an electronic device, a battery which is used as a power supply should be periodically charged. To periodically charge an electronic device, a wired charging device (for example, a charging cable, a travel adapter (TA)) may be connected to the electronic device, and the electronic device may be charged through a wired cable. According to a related-art wired charging method, a wired cable should be connected to the electronic device every time the electronic device is charged, which may cause a user inconvenience. Therefore, technology for charging a battery disposed in an electronic device using wireless power transmission technology instead of a wired cable is used in recent years.

When an electronic device is charged using a wireless charging device, thermal energy generated in the electronic device in a wireless power reception process may cause heat to be generated in the electronic device. Electric elements in the electronic device may be influenced by heat of the electronic device. For example, since the heat of the electronic device may cause a damage to a battery in the electronic device, wireless charging should be stopped or a wireless charging speed or an intensity of a current for wirelessly charging should be changed when a temperature of the electronic device is higher than a predetermined temperature.

There was a demand for a method for minimizing an influence by heat and for cooling an electronic device held on a wireless charging device for the sake of smooth wireless charging, and accordingly, an indirect cooling method for indirectly cooling an electronic device by reducing heat generated in a wireless charging device through drawn-in air was suggested.

However, since the indirect cooling method indirectly cools heat generated in the wireless charging device through drawn-in air, the electronic device may not be smoothly cooled in a high-output charging mode or a quick charging mode.

As a method for smoothly charging in a quick charging mode or a high-output charging mode, a cooling fan may be used. The cooling fan may directly cool an electronic device held on a wireless charging device by directly spraying cooled air onto the electronic device.

The direct cooling method may efficiently cool an electronic device compared to the indirect cooling method, but may require a discharge hole to be formed on a similar position to that of the cooling fan and in a similar shape to that of the cooling fan in order to reduce a loss of flow of air discharged from the cooling fan.

In addition, a wireless charging device adopting the direct cooling method may use one cooling fan. When one cooling fan is used, there may be a difference in a flow of cooled air and in a contact area between cooled air and an electronic device, according to a position of the cooling fan and/or a direction in which the electronic device is held on the wireless charging device (for example, held in a horizontal direction or held in a vertical direction), and thus cooling efficiency may not be uniform.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide a wireless charging device which can efficiently cool an electronic device using a dual cooling fan, without being influenced by a position of the cooling fan and/or a holding state of the electronic device.

According to various example embodiments, a wireless charging device may include: a housing including a holding portion configured to hold an external electronic device thereon; a first bracket positioned in the holding portion; a conductive coil disposed in the first bracket; a second bracket positioned in the holding portion and including a penetrating hole; a first cooling fan positioned in the penetrating hole; a second cooling fan positioned in the penetrating hole and spaced apart from the first cooling fan; and a partition formed in the penetrating hole to isolate the first cooling fan and the second cooling fan from each other, the penetrating hole being divided into a first area including the first cooling fan and a second area including the second cooling fan positioned therein, at least one protrusion having a volute shape formed on at least a portion of the second bracket or at least a portion of the partition, a first opening formed on at least an area of the first bracket to allow air cooled by the first cooling fan or the second cooling fan to move to the holding portion, and a second opening formed on at least an area of the holding portion to allow the air transmitted from the first opening to move outside the wireless charging device.

According to various example embodiments, a wireless charging device may include: a housing including a holding portion configured to hold an external electronic device thereon; a first bracket positioned in the holding portion; a conductive coil disposed in the first bracket; a second bracket positioned in the holding portion and having a penetrating hole therein; a first cooling fan positioned in the penetrating hole; a second cooling fan positioned in the penetrating hole and spaced apart from the first cooling fan; a partition formed in the penetrating hole to isolate the first cooling fan and the second cooling fan from each other; and a processor configured to control an operation of the first cooling fan and/or the second cooling fan, wherein the penetrating hole is divided into a first area including the first cooling fan, and a second area including the second cooling fan, at least one protrusion having a volute shape formed on at least a portion of the second bracket or at least a portion of the partition, a first opening formed on at least an area of the first bracket to allow air cooled by the first cooling fan and/or the second cooling fan to move to the holding portion under control of the processor, and a second opening formed on at least an area of the holding portion to allow the air transmitted from the first opening to move to an outside of the wireless charging device.

According to various example embodiments, a method of a wireless charging device may include: identifying an external electronic device functionally connected with the wireless charging device; receiving usage environment information of the wireless charging device from the external electronic device based on the identification; and controlling an operation of at least one of a first cooling fan and a second cooling fan disposed in the wireless charging device based at least on the usage environment information.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1A:
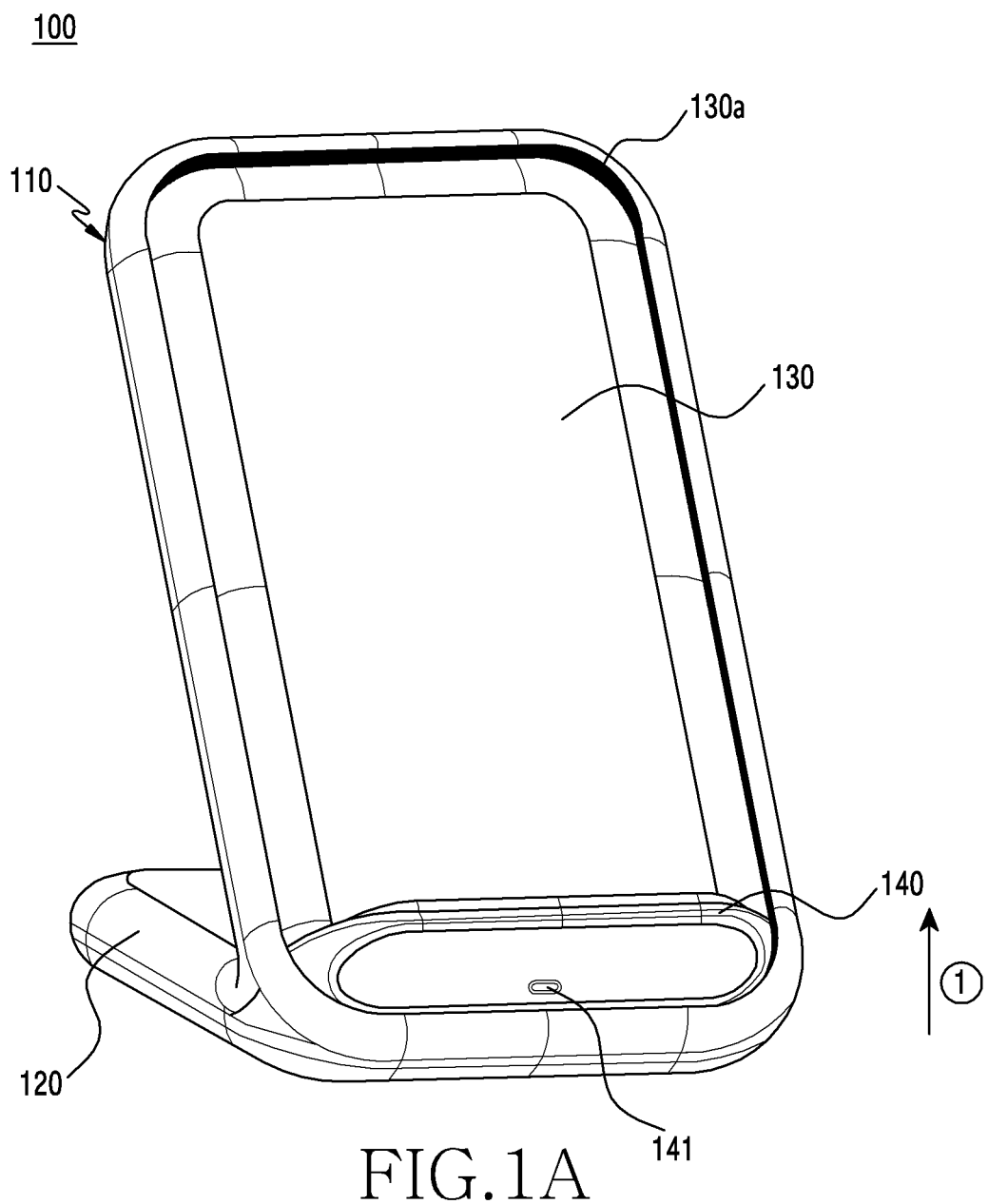
FIG. 1A is a perspective view of an example wireless charging device according to various embodiments.

An electronic device according to various example embodiments of the disclosure may be various types of electronic devices. The electronic device may include, for example, a portable communication device (for example, a smartphone), a computer device, a portable multimedia device, a portable medical device, a camera, a wearable device, a home appliance, or the like. The electronic device according to various embodiments of the disclosure is not limited to the above-described devices.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 1B:
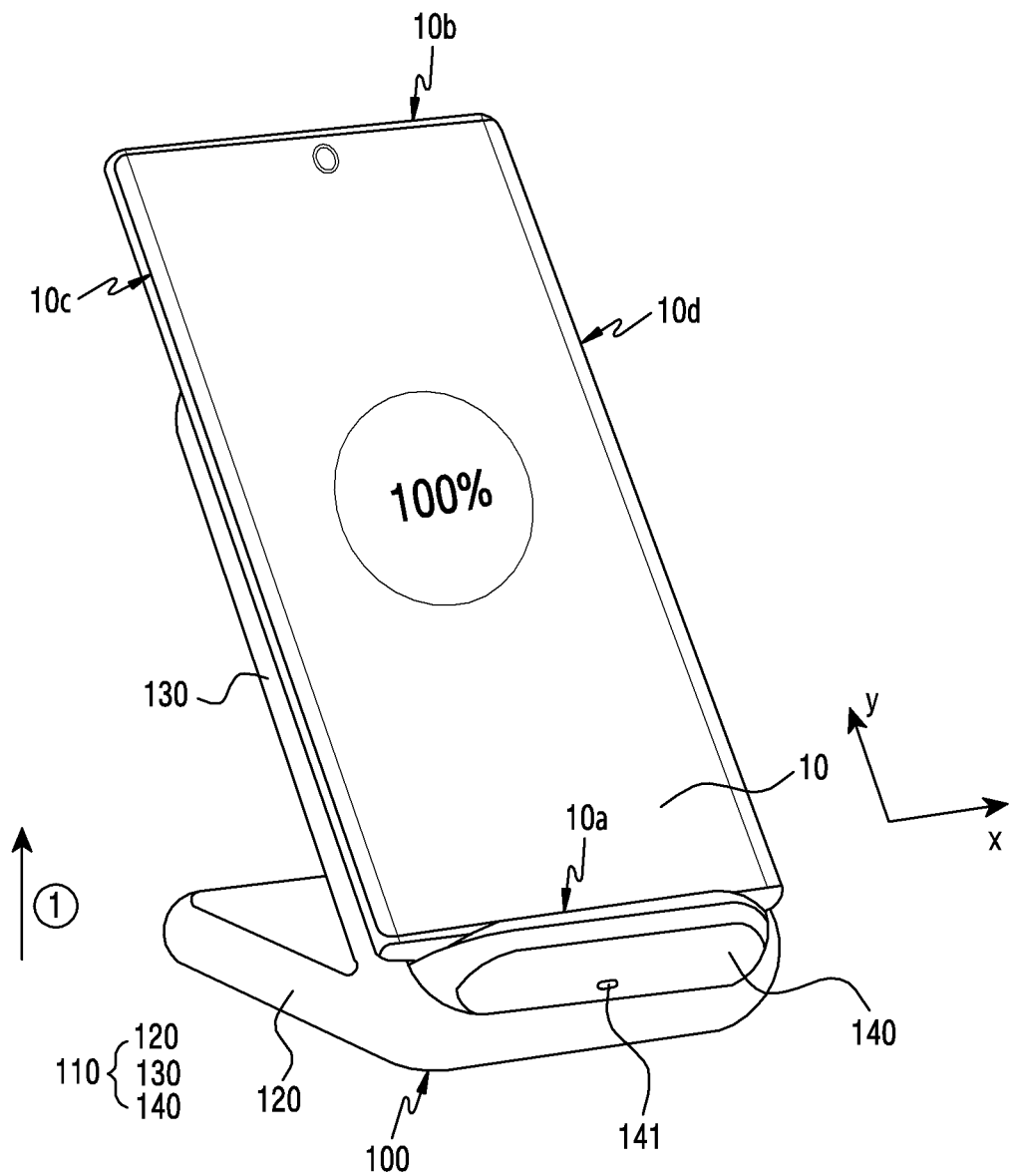
FIG. 1B is a perspective view illustrating an example state in which an electronic device is held on the wireless charging device in a vertical direction and is wirelessly charged according to various embodiments.
Figure 1C:
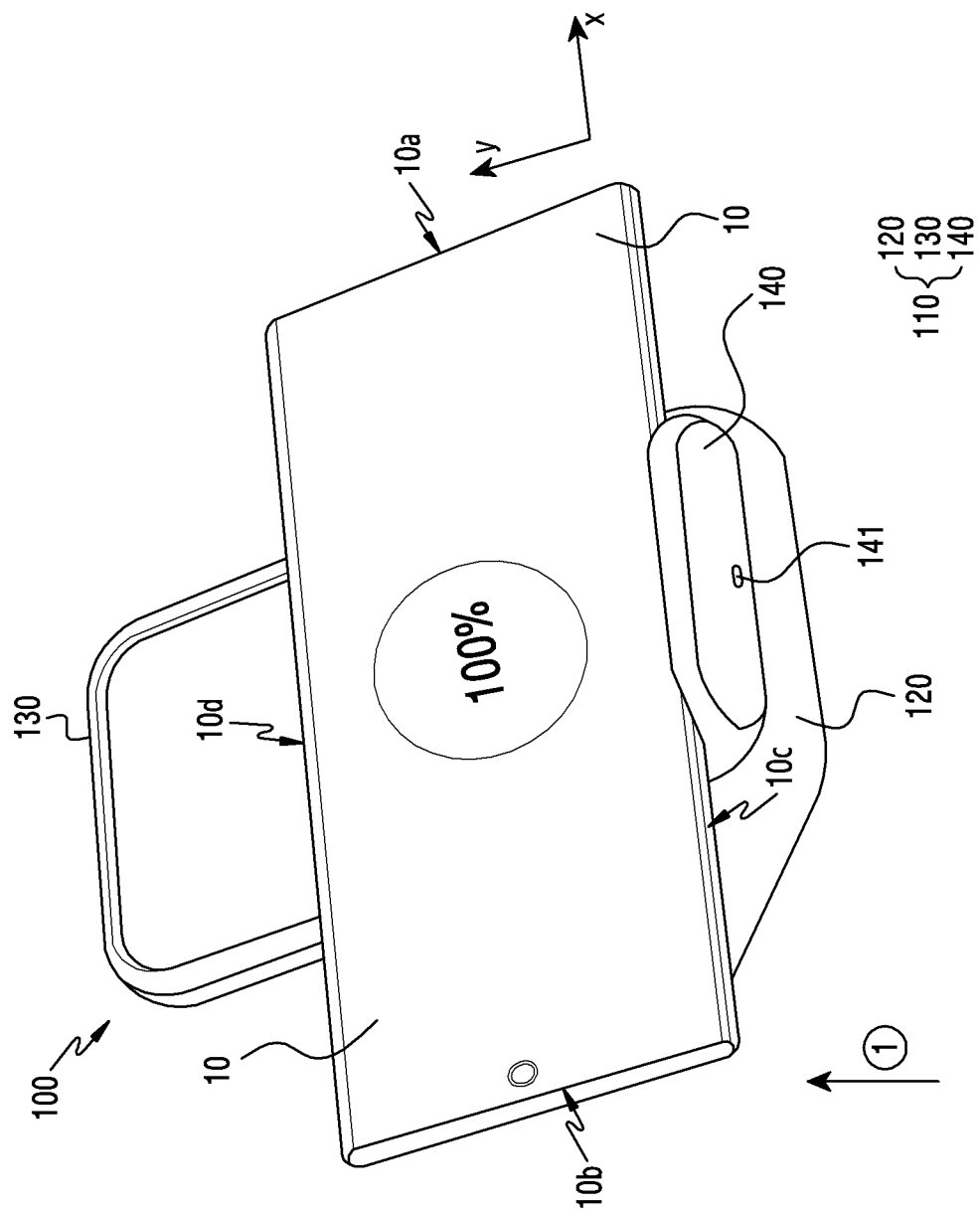
FIG. 1C is a perspective view illustrating an example state in which the electronic device is held on the wireless charging device in a horizontal direction and is wirelessly charged according to various embodiments.

FIG. 1A is a perspective view illustrating an example wireless charging device 100 according to various embodiments. FIG. 1B is a perspective view illustrating an example state in which an electronic device 10 is held on the wireless charging device 100 in a vertical direction and is wirelessly charged according to various embodiments. FIG. 1C is a perspective view illustrating an example state in which the electronic device 10 is held on the wireless charging device 100 in a horizontal direction and is wirelessly charged according to various embodiments.

Referring to FIGS. 1A, 1B, and 1C, the wireless charging device 100 according to an embodiment may include a housing 110, and the housing 110 may, for example, and without limitation, form an exterior of the wireless charging device 100.

According to various embodiments, the housing 110 of the wireless charging device 100 may include a base 120, a holding portion 130, and a support portion 140. The base 120 according to an embodiment may be positioned on a lower end of the wireless charging device 100 to fix the wireless charging device 100 on a flat surface.

The holding portion 130 according to an embodiment may be extended from the base 120 in one direction (for example, the direction of ① of FIG. 1A). According to an embodiment (for example, see FIG. 1A), the holding portion 130 may be extended to form a predetermined tilt angle with the base 120. In an embodiment, the holding portion 130 may be extended to form a title angle of, for example, 40° to 70°, 30° to 80°, or 70° to 90° with the base 120, but this should not be considered as limiting. According to an embodiment (not shown), the holding portion 130 may be extended in a direction substantially perpendicular to the base 120.

The support portion 140 according to an embodiment may be extended in a direction substantially perpendicular to the holding portion 130, and may have a connector hole 141 formed on at least an area of the support portion 140. The wireless charging device 100 may have an external cable (not shown) connected thereto through the connector hole 141, and may receive external power through the external cable. However, an angle between the support portion 140 and the holding portion 130 is not limited to the embodiment illustrated in the drawings, and the holding portion 130 and the support portion 140 may form a predetermined tilt angle according to an embodiment.

According to an embodiment, the position of the connector hole 141 is not limited to the position displayed on the drawings, and the connector hole 141 may be formed on various positions according to a design of the wireless charging device 100. For example, the connector hole 141 may be formed on a side surface of a periphery of the base 120.

According to an embodiment, the wireless charging device 100 may hold the electronic device 10 on the holding portion 130 through the support portion 140. For example, when one surface (for example, a rear surface) of the electronic device 10 comes into contact with one surface of the holding portion 130, the support portion 140 may support one periphery of the electronic device 10 contacting the holding portion 130, such that the electronic device 10 can be held on the wireless charging device 100. A structure of the wireless charging device 100 for supporting the electronic device 10 or a method for supporting the electronic device 10 is not limited to the features described in the disclosure, and the electronic device 10 may be supported through various methods or structures. For example, when at least one side surface of the wireless charging device 100 is structured to surround at least a portion of the electronic device 10, the wireless charging device 100 may hold the electronic device 10 even if there is no separate support portion 140. According to an embodiment, the wireless charging device 100 may include a securing portion (not shown) having at least a portion secured to a first periphery 10a or a second periphery 10b of the electronic device 10 in part.

According to various embodiments, the electronic device 10 may be held on the wireless charging device 100 in various directions. According to an embodiment (for example, see FIG. 1B), the electronic device 10 may be held on the wireless charging device 100 in the vertical direction (for example, the y direction of FIG. 1B), and according to an embodiment (for example, see FIG. 1C), the electronic device 10 may be held on the wireless charging device 100 in the horizontal direction (for example, the x direction of FIG. 1C).

The electronic device 10 may include the first periphery 10a which is extended in a first direction (for example, the x direction of FIG. 1B), the second periphery 10b which is substantially parallel to the first periphery 10a, a third periphery 10c which has a length longer than the first periphery 10a and/or the second periphery 10b, and is extended in a second direction (for example, the y direction of FIG. 1B) substantially perpendicular to the first direction, and a fourth periphery 10d which is substantially parallel to the third periphery 10c. In the disclosure, the first periphery 10a, the second periphery 10b which have relatively short lengths may be referred to as width-direction peripheries, and the third periphery 10c, the fourth periphery 10d which have relatively long lengths may be referred to as length-direction peripheries.

In addition, the case where the electronic device 10 is held on the wireless charging device 100 in the vertical direction (for example, see FIG. 1B) may refer to a case where one periphery of the electronic device 10 supported by the support portion 140 when the electronic device 10 is held on the wireless charging device 100 is a width-direction periphery (for example, the first periphery 10a, the second periphery 10b). To the contrary, the case where the electronic device 10 is held on the wireless charging device 100 in the horizontal direction (for example, see FIG. 1C) may refer to a case where one periphery of the electronic device 10 supported by the support portion 140 when the electronic device 10 is held on the wireless charging device 100 is a length-direction periphery (for example, the third periphery 10c, the fourth periphery 10d).

According to an embodiment, a conductive coil (not shown) and/or a cooling fan (not shown) may be disposed in the holding portion 130, and the wireless charging device 100 may wirelessly charge a battery of the electronic device 10 held on the wireless charging device 100 through the conductive coil, or may cool the electronic device 10 through the cooling fan.

According to an embodiment, an air intake hole (not shown) may be formed on one surface (for example, a rear surface) of the holding portion 130, and an air discharge hole (for example, an air discharge hole 130a of FIG. 1A) may be formed on the other surface (for example, a front surface) of the holding portion 130. Air drawn into the holding portion 130 through the air intake hole may be cooled by rotation of the cooling fan, and the air cooled by the cooling fan may be discharged to the outside of the wireless charging device 100 through the air discharge hole 130a and may cool the electronic device 10. The air discharge hole 130a may be formed along a periphery of the front surface of the holding portion 130 in a band shape (for example, a rectangular band). However, a position where the air discharge hole 130a is formed is not limited to the illustrated embodiment, and the air discharge hole 130a may be formed on a periphery of a portion (for example, a periphery of a left side and/or a periphery of a right side) of the front surface of the holding portion 130.

Figure 2:
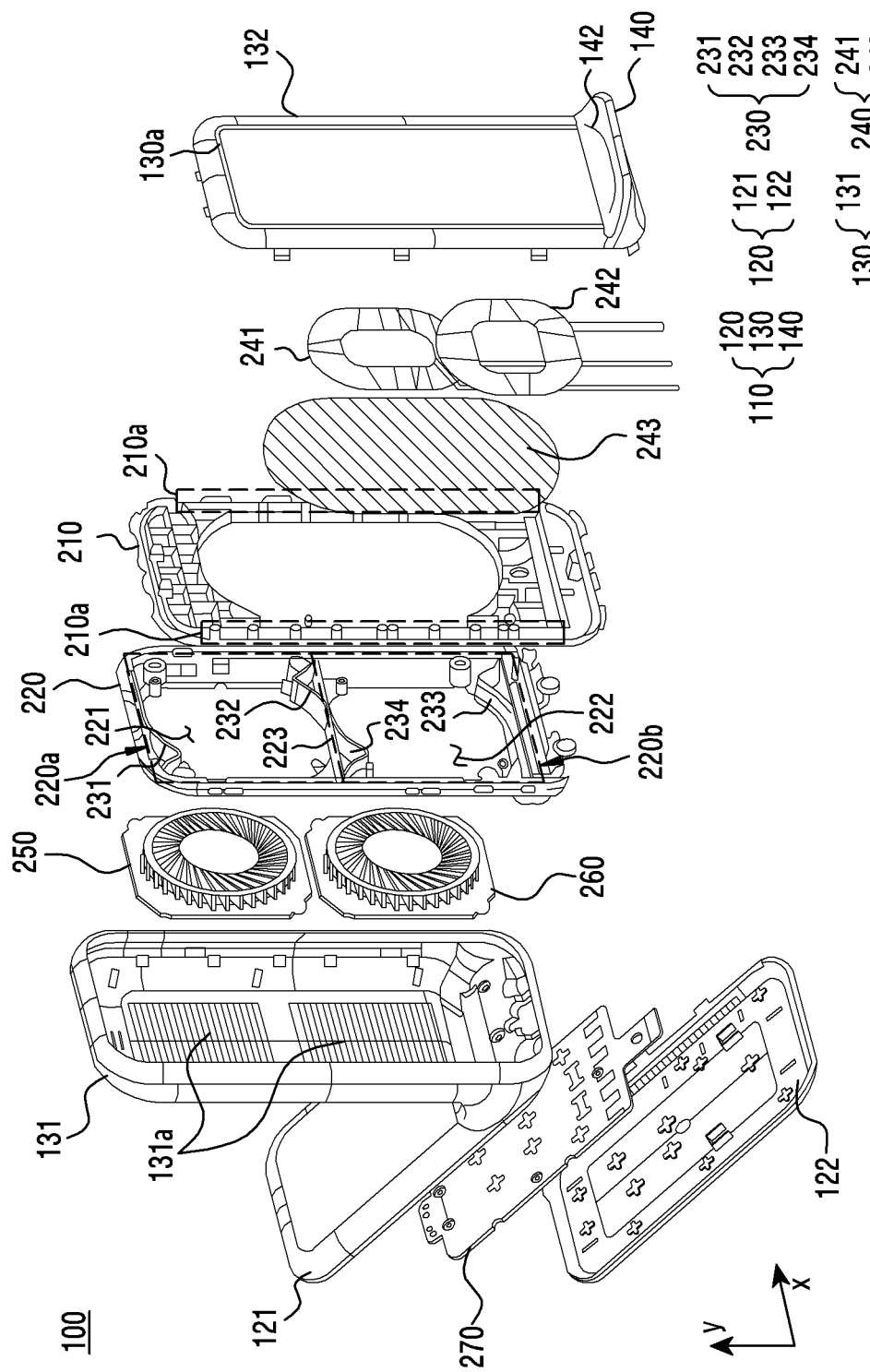
FIG. 2 is an exploded perspective view illustrating an example wireless charging device according to various embodiments.

FIG. 2 is an exploded perspective view illustrating an example wireless charging device 100 according to various embodiments.

Referring to FIG. 2, the wireless charging device 100 (for example, the wireless charging device 100 of FIG. 1A) according to an embodiment may include a housing 110, a conductive coil 240, a first bracket 210, a second bracket 220, cooling fans 250, 260, and a printed circuit board (PCB) 270.

According to an embodiment, the housing 110 may form an exterior of the wireless charging device 100, and may provide a space to have a plurality of components disposed therein. The housing 110 may include a base 120 (for example, the base 120 of FIG. 1A) and a holding portion 130 (for example, the holding portion 130 of FIG. 1A) extended from the base in one direction.

For example, the base 120 may be formed by coupling a lower end cover 122 to a base frame 121, and the holding portion 130 may be formed by coupling a front surface cover 132 to a holding portion frame 131. A space may be formed between the base frame 121 and the lower end cover 122 of the base 120, and at least one component (for example, the printed circuit board 270) may be disposed in the base 120 through the space.

According to an embodiment, a space may be formed between the holding portion frame 131 and the front surface cover 132 of the holding portion 130, and at least one component (for example, the conductive coil 240, the cooling fans 250, 260) may be disposed in the holding portion 130 through the space. According to an embodiment, the base frame 121 and the lower end cover 122, and the holding portion frame 131 and the front surface frame 132 may be integrally formed with each other. In this case, a space may be formed in the base 120 and/or the holding portion 130, and a plurality of components may be disposed in the base 120 and/or the holding portion 130 through the space.

According to an embodiment, a support portion 140 (for example, the support portion 140 of FIG. 1A) may protrude from a lower end area of the front surface cover 132. The support portion 140 may protrude in a predetermined direction (for example, a substantially perpendicular direction) from the front surface cover 132, such that a certain area of the electronic device can be supported by the support portion 140 when the electronic device is held on the wireless charging device 100, and as a result, the electronic device (for example, the electronic device 10 of FIGS. 1B, 1C) is held on the wireless charging device 100. According to an embodiment, a seating recess 142 may be formed on one surface of the support portion 140 on which the electronic device is held, and the electronic device may be seated on the seating recess 142 during a wireless charging process.

According to an embodiment, the first bracket 210 may be disposed in an inner space of the holding portion 130. The conductive coil 240 (e.g., a "power transmission coil") may be disposed on one surface of the first bracket 210 that is adjacent to the holding portion 130, and for example, the conductive coil 240 may be disposed to face the front surface cover 132 of the holding portion 130.

For example, the wireless charging device 100 may be connected with an external cable through a connector hole (for example, the connector hole 141 of FIG. 1A), and the external cable may supply power to the wireless charging device 100 to apply power to the conductive coil 240. When power is applied to the conductive coil 240, an induced current may be generated in the conductive coil 240 and the induced current generated in the conductive coil 240 may cause an induced current to be generated in the power reception coil in the electronic device by the electromagnetic induction phenomenon. Accordingly, the electronic device may wireless charge a battery using the induced current generated in the power reception coil through the above-described process.

According to an embodiment, the method of the wireless charging device 100 for charging the electronic device is not limited to the electromagnetic induction method, and the wireless charging device 100 according to various embodiments may charge the electronic device using a magnetic resonance method or an electromagnetic wave method.

According to an embodiment, the conductive coil 240 may, for example, and without limitation, be a coil that is formed by winding a copper line in a spiral pattern, or may be formed in a thin-type like a film, and may be disposed substantially close to one surface of the front surface cover 132 or may be disposed substantially in parallel with one surface of the front surface cover 132 with a predetermined gap therebetween. According to an embodiment, the conductive coil 240 may include a first conductive coil 241 disposed on an upper end area of the first bracket 210, and a second conductive coil 242 disposed on a lower end area of the first bracket 210. According to an embodiment, the first conductive coil 241 and the second conductive coil 242 may be disposed to have some areas thereof overlap each other when viewed from the outside of the wireless charging device 100. However, the conductive coil 240 including the first conductive coil 241 and the second conductive coil 242 is merely an example of the disclosure, and according to an embodiment, the conductive coil 240 may include one conductive coil or may include a plurality of conductive coils (for example, three conductive coils). According to an embodiment, the first conductive coil 241 and the second conductive coil 242 may be disposed not to overlap each other.

According to an embodiment, a shielding member (e.g., a shield) 243 may be disposed between the first bracket 210 and the conductive coil 240, and the shielding member 243 may prevent and/or reduce a noise generated in the conductive coil 240. The shielding member 243 may, for example, be formed with a ferrite material, for example, but is not limited thereto, and the shielding member 243 may be formed with other materials as long as a noise generated in the conductive coil 240 can be prevented and/or reduced.

According to an embodiment, the second bracket 220 may be disposed on a rear surface of the first bracket 210 in the holding portion 130. The second bracket 220 may have a penetrating hole 220a, 220b penetrating therethrough.

According to an embodiment, a partition 223 may be formed in the penetrating hole 220a, 220b of the second bracket 220 to be extended in the horizontal direction (for example, the x direction of FIG. 2). The partition 223 may be extended in the horizontal direction (for example, the x direction of FIG. 2) of the penetrating hole 220a, 220b, such that the penetrating hole 220a, 220b can form a space to allow the first cooling fan 250 and the second cooling fan 260 to operate independently. In an embodiment, the partition 223 may divide the inner space of the penetrating hole 220a, 220b into a first area 221 and a second area 222, and the first cooling fan 250 and the second cooling fan 260 may be independently disposed in the first area 221 and the second area 222. For example, the partition 223 may divide the inner space of the penetrating hole 220a, 220b into two areas (for example, the first area 221, the second area 222), and may prevent and/or reduce air flow interference between the first cooling fan 250 and the second cooling fan 260, which will be described in greater detail below. In the disclosure, the first area 221 may refer to an area of the penetrating hole 220a corresponding to the upper end of the second bracket 220, and the second area 222 may refer to an area of the penetrating hole 220b corresponding to the lower end of the second bracket 220.

According to an embodiment, the first cooling fan 250 and the second cooling fan 260 may be disposed in the first area 221 and the second area 222 of the second bracket 220, respectively, which are divided by the partition 223. However, the positions of the first cooling fan 250 and the second cooling fan 260 are not limited to the illustrated embodiment, and may be changed according to various embodiments. The first cooling fan 250 and the second cooling fan 260 may be disposed to have one surface facing the first bracket 210 and the other surface facing the holding portion frame 131 of the holding portion 130.

According to an embodiment, a plurality of air intake holes 131a may be formed on at least one area of the holding portion frame 131, and external air may flow into the holding portion 130 through the air intake holes 131a. The external air flowing into the holding portion 130 may be cooled by rotation of the first cooling fan 250 and the second cooling fan 260 which are disposed to face the holding portion frame 131. The air cooled by the first cooling fan 250 and the second cooling fan 260 may flow from the second bracket 220 toward the front surface cover 132 through an air flow hole 210a formed on at least one area of the first bracket 210. The cooled air which flows toward the front surface cover 132 through the air flow hole 210a may be discharged to the outside of the wireless charging device 200 through a air discharge hole 130a (for example, the air discharge hole 130a of FIG. 1A) formed on the front surface cover 132, and the cooled air discharged to the outside of the wireless charging device 100 may cool the electronic device held on the wireless charging device 100. In this case, since the air discharge hole 130a is the same as or similar to the air discharge hole 130a of FIG. 1A, a redundant explanation thereof may not be repeated here.

According to an embodiment, the air flow hole 210a may be formed along an area of the left periphery and/or an area of the right periphery of the first bracket 210, but is not limited thereto. According to an embodiment, the air flow hole 210a may be extended along an upper end periphery, a left periphery, a lower end periphery, and a right periphery of the first bracket 210, and may be formed in a band shape.

According to an embodiment, a plurality of protrusions 230 may be formed in the first area 221 and the second area 222 of the second bracket 220. The plurality of protrusions 230 may protrude in a predetermined direction (for example, a direction toward the first area 221 or the second area 222). For example, a portion of a first protrusion 231 and/or a second protrusion 232 may protrude toward the inside of the first area 221. In another example, at least a portion of a third protrusion 233 and/or a fourth protrusion 234 may protrude toward the inside of the second area 222. According to an embodiment, the protrusions 230 may protrude toward the first area 221, the second area 222, thereby reducing a loss of flow caused in the process of moving air cooled by the first cooling fan 250 and the second cooling fan 260. A process of preventing and/or reducing a loss of flow through the protrusions 230 will be described in greater detail below.

According to an embodiment, the printed circuit board 270 may be disposed in an inner space of the base 120. A plurality of components for operating the wireless charging device 100 may be disposed on the printed circuit board 270. For example, a processor (not shown) may be disposed on the printed circuit board 270. The processor may be operatively connected with the first cooling fan 250, the second cooling fan 260, and/or the conductive coil 240 to control the first cooling fan 250, the second cooling fan 260, and/or the conductive coil 240 to operate the wireless charging device 100. A process of the processor operating the wireless charging device 100 will be described in detail below.

Figure 3A:
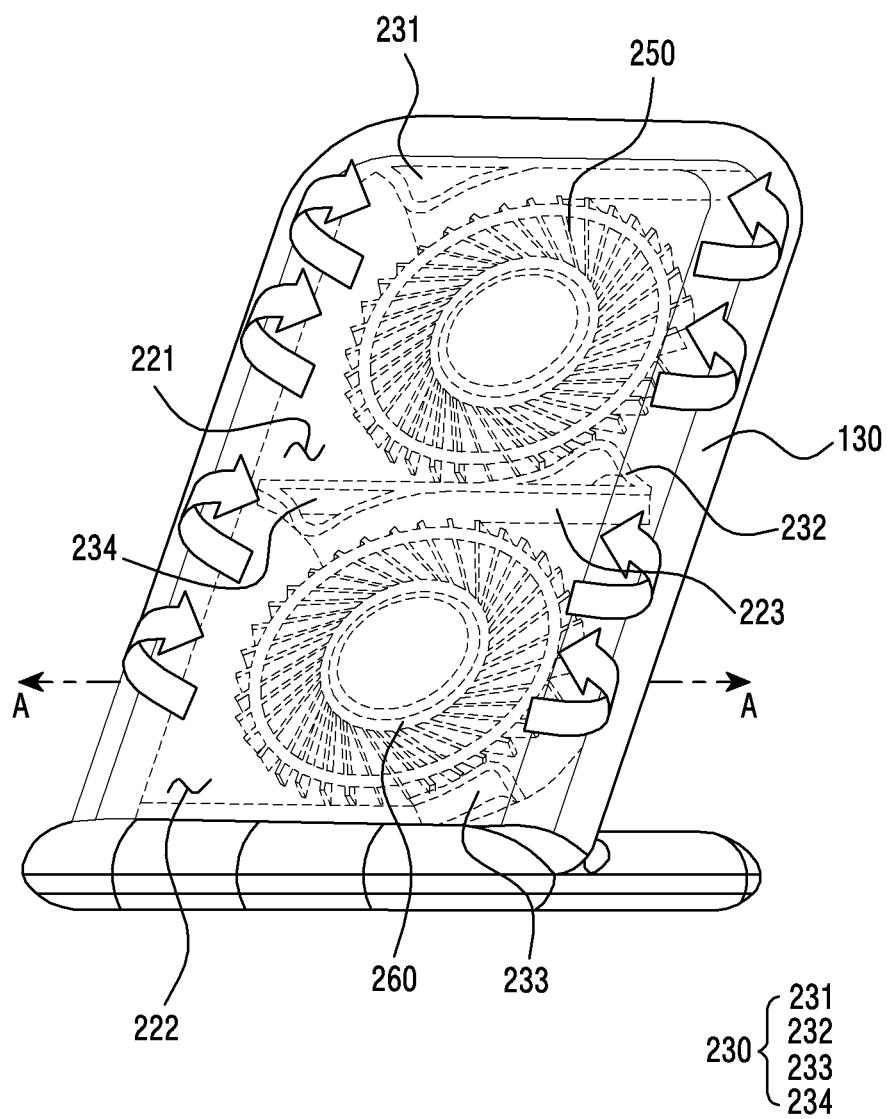
FIG. 3A is a perspective view illustrating an example process of moving air cooled by a first cooling fan and/or a second cooling fan to the outside of a wireless charging device according to various embodiments.
Figure 3B:
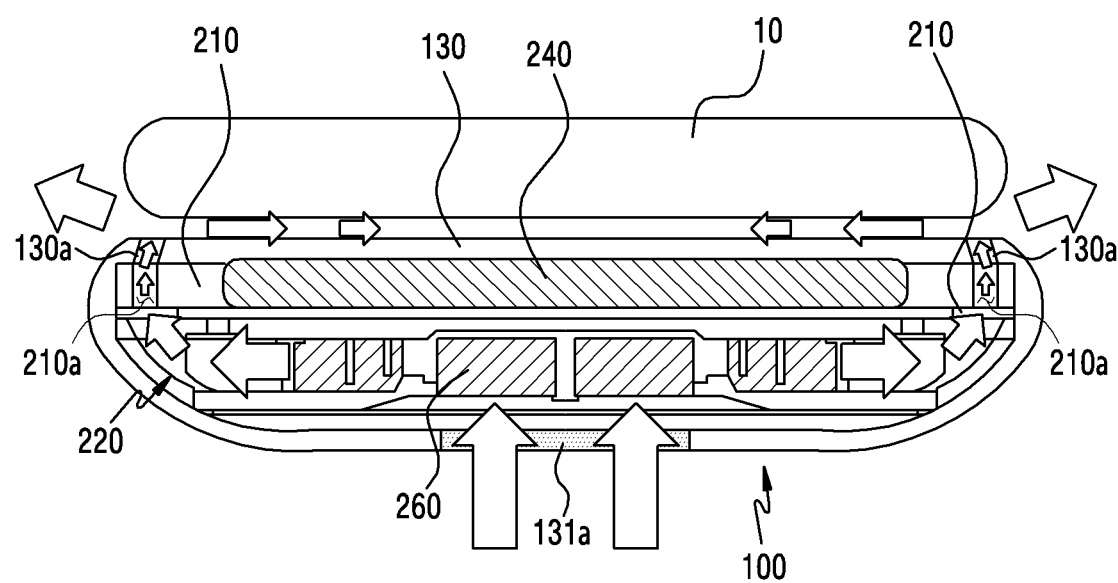
FIG. 3B is a cross-sectional view of the wireless charging device of FIG. 3A, taken along line A-A, with the electronic device being held thereon according to various embodiments.

FIG. 3A is a perspective view illustrating an example process of moving air cooled by a first cooling fan (for example, the first cooling fan 250 of FIG. 2) and/or a second cooling fan (for example, the second cooling fan 260 of FIG. 2) to the outside of a wireless charging device 100 (for example, the wireless charging device 100 of FIG. 2) according to various embodiments. FIG. 3B is a cross-sectional view of the wireless charging device 100 of FIG. 3A, taken along line A-A, with an electronic device 10 being held thereon according to various embodiments. Hereinafter, a cooled air flowing process in the wireless charging device 100 will be described with reference to FIGS. 3A and 3B.

Referring to FIGS. 3A and 3B, the wireless charging device 100 (for example, the wireless charging device 100 of FIG. 2) according to an embodiment may include a holding portion 130 (for example, the holding portion 130 of FIG. 1A), and a first cooling fan 250 (for example, the first cooling fan 250 of FIG. 2) and a second cooling fan 260 (for example, the second cooling fan 260 of FIG. 2) which are disposed in the holding portion 130.

According to an embodiment, a first bracket 210 (for example, the first bracket 210 of FIG. 2) and a second bracket 220 (for example, the second bracket 220 of FIG. 2) may be disposed in the holding portion 130. For example, the second bracket 220 may be disposed on a rear surface of the first bracket 210. Accordingly, the first bracket 210 may be disposed adjacent to a front surface of the holding portion 130 (for example, an upper end surface of the holding portion 130 of FIG. 3B), and the second bracket 220 may be disposed adjacent to a rear surface of the holding portion 130 (for example, a lower end surface of the holding portion 130 of FIG. 3B).

A conductive coil 240 (for example, the conductive coil 240 of FIG. 2) may be disposed in the first bracket 210, and a penetrating hole (for example, the penetrating hole 220a, 220b of FIG. 2) may be formed in the second bracket 220 and the first cooling fan 250 and the second cooling fan 260 may be disposed in the penetrating hole.

According to an embodiment, a partition 223 (for example, the partition 223 of FIG. 2) may be formed in the penetrating hole, and may be extended in the substantially horizontal direction (for example, the x direction of FIG. 2) in the penetrating hole, such that the inside of the penetrating hole is divided into a first area 221 (for example, the first area 221 of FIG. 2) and a second area 222 (for example, the second area 222 of FIG. 2).

For example, the first cooling fan 250 may be disposed in the first area 221 of the penetrating hole divided by the partition 223, and the second cooling fan 260 may be disposed in the second area 222 of the penetrating hole divided by the partition 223. For example, the area where the first cooling fan 250 is disposed and the area where the second cooling fan 260 is disposed may be divided by the partition 223, and as a result, the first cooling fan 250 and the second cooling fan 260 may independently cool the electronic device 10 held on the wireless charging device 100.

According to an embodiment, a plurality of air intake holes 131a (for example, the air intake holes 131a of FIG. 2) may be formed on at least one area of the rear surface of the holding portion 130 (for example, the lower end surface of the holding portion 130 of FIG. 3B), and an air discharge hole 130a (for example, the air discharge hole 130a of FIG. 2) may be formed on at least one area of the front surface of the holding portion 130 (for example, the front surface 132 of FIG. 2, the upper end surface of the holding portion 130 of FIG. 3).

External air of the wireless charging device 100 may flow into the wireless charging device 100 through the air intake holes 131a formed on the rear surface of the holding portion 130. The air flowing into the wireless charging device 100 may be cooled by the first cooling fan 250 and/or the second cooling fan 260 disposed in the second bracket 220, and then may flow into an air flow hole 210a (for example, the air flow hole 210a of FIG. 2) formed on the front surfaces of the first cooling fan 250 and the second cooling fan 260. According to an embodiment, the air flow hole 210a may be formed on at least one area of the first bracket 210 which is disposed on the front surfaces of the first cooling fan 250 and the second cooling fan 260, and may be formed on a position substantially corresponding to the air discharge hole 130a formed on the front surface of the holding portion 130 or adjacent to the air discharge hole 130a.

For example, the air flow hole 210a may be formed along a left periphery area and/or a right periphery area of the first bracket 210, and according to various embodiments, the air flow hole 210a may be extended along an upper end periphery, a left periphery, a lower end periphery, a right periphery of the first bracket 210 in a band shape.

The air cooled by the first cooling fan 250 and/or the second cooling fan 260 may pass through the air flow hole 210a, and then may be discharged to the outside of the wireless charging device 100 through the air discharge hole 130a formed on the front surface of the holding portion 130. The cooled air discharged to the outside of the wireless charging device 100 may cool the electronic device 10 held on the holding portion 130 of the wireless charging device 100, and as a result, a temperature of the electronic device 100 can be prevented and/or reduced from increasing to a designated temperature or higher even when high-output or high-speed wireless charging is performed.

For example, external air of the wireless charging device 100 may flow into the wireless charging device 100 through the air intake holes 131a and may be cooled, and the cooled air may pass through the air flow hole 210a and then may be discharged to the outside of the wireless charging device 100 through the air discharge hole 130a. Although FIG. 3B of the disclosure illustrates the structure where the air intake holes 131a, the air flow hole 210a, and the air discharge hole 130a are arranged with reference to the area of the second cooling fan 260, the air intake holes 131a, the air flow hole 210a, or the air discharge hole 130a may be disposed on substantially the same positions in the area of the first cooling fan 250 as in the area of the second cooling fan 260.

The wireless charging device 100 according to an embodiment may use the two cooling fans (for example, the first cooling fan 250, the second cooling fan 260), so that the electronic device 10 held on the wireless charging device 100 can be cooled more efficiently than when one cooling fan is used.

Cooling efficiency of the wireless charging device 100 increases as a heat transfer rate (Q) increases, and, according to the Newton's cooling law, when a temperature difference ($^\Delta$T) between external air and an outside of the electronic device 10 is constant, the heat transfer rate (Q) increases as the convective heat transfer coefficient (h) and a cooling area (A) (or an "air discharge area") increase, as indicated by Equation 1 presented below:

$$Q = h \cdot A \cdot \Delta T \qquad \text{Equation 1}$$

According to an embodiment, the wireless charging device 100 cools external air of the wireless charging device 100 using the first cooling fan 250 and the second cooling fan 260, so that a cooling area can increase (for example, increases by two times) in comparison to a case where one cooling fan is used.

When only the cooling area increases with a constant rate of flow for cooling, a flow speed of cooled air may be reduced. The convective heat transfer coefficient (h) is proportional to the flow speed, and, when the flow speed of the cooled air is reduced, the convective heat transfer coefficient (h) may be reduced, and the heat transfer rate (Q) may not increase despite the increase of the cooling area.

For example, when the electronic device 10 is cooled using one cooling fan and only an area of the air discharge hole 130a through which cooled air is discharged increases in order to increase a cooling area as in a related-art wireless charging device, a flow speed of the cooled air may be reduced and thus cooling efficiency may not increase.

However, the wireless charging device 100 according to an embodiment cools the electronic device 10 using the first cooling fan 250 and the second cooling fan 260, such that a rate of flow for cooling can increase by a predetermined value (for example, two times) in comparison to the case where one cooling fan is used. As the rate of flow for cooling increases, the cooling area can be increased while a flow speed of the cooled air is constantly maintained.

TABLE 1

|  | Single fan | Dual fan | Increase of rotation speed |
|---|---|---|---|
| h (W/m² · K) | 10 | 10 | 15 |
| A (m²) | 0.01 | 0.02 | 0.02 |
| ΔT (K) | 15 | 15 | 15 |
| Q (W) | 1.5 | 3 | 4.5 |

Table 1 is a table illustrating example comparison of heat transfer rates or cooling efficiency when the electronic device is cooled using one cooling fan (single fan), when the electronic device is cooled using two cooling fans (dual fan), and when the electronic device is cooled using two cooling fans and increasing rotation speeds of the cooling fans.

As illustrated in table 1, the wireless charging device 100 according to an embodiment can constantly maintain a flow speed of cooled air, while increasing a cooling area by two times through the first cooling fan 250 and the second cooling fan 260. As a result, the wireless charging device 100 according to an embodiment can increase a heat transfer rate (Q) by two times in comparison to the wireless charging device using one cooling fan, so that the electronic device 10 held on the wireless charging device 100 can be more efficiently cooled.

The wireless charging device 100 according to an embodiment may adjust a rotation speed of the first cooling fan 250 and/or the second cooling fan 260 according to a usage environment, and may adjust cooling efficiency by adjusting the rotation speed of the first cooling fan 250 and/or the second cooling fan 260.

For example (e.g., see table 1), the wireless charging device 100 may increase the convective heat transfer coefficient by increasing the rotation speed of the first cooling fan 250 and/or the second cooling fan 260, and, by doing so, may increase the cooling efficiency of the wireless charging device 100. In another example (not shown), the wireless charging device 100 may reduce the convective heat transfer coefficient by reducing the rotation speed of the first cooling fan 250 and/or the second cooling fan 260, and by doing so, may reduce the cooling efficiency of the wireless charging device 100.

For example, the wireless charging device 100 according to an embodiment may adjust the cooling efficiency by controlling the rotation speed of the first cooling fan 250 and/or the second cooling fan 260 according to a usage environment. A process of controlling the rotation speed of the first cooling fan 250, the second cooling fan 260 according to a usage environment of the wireless charging device 100 will be described in greater detail below.

TABLE 2

|  | TA input | Temperature of front surface | Temperature of rear surface |
| --- | --- | --- | --- |
| Single fan | 11.9 V, 1.4 A | 40.2 (° C.) | 40.4 (° C.) |
| Dual fan | 11.9 V, 1.4 A | 37.4 (° C.) | 38.1 (° C.) |

Table 2 is a table illustrating an example comparison of temperatures of the front surface, the rear surface of an electronic device when the electronic device is cooled using one cooling fan (single fan) and when the electronic device is cooled using two cooling fans (dual fan) in the process of wirelessly charging through the wireless charging device.

Referring to table 2, when the electronic device held on the wireless charging device is cooled using one cooling fan under a condition where the wireless charging device is supplied with 11.9V, 1.4 A through an external cable, the temperature of the front surface of the electronic device may be 40.2° C., and the temperature of the rear surface may be 40.4° C. On the other hand, when the electronic device held on the wireless charging device is cooled using two cooling fans, the temperature of the front surface of the electronic device may be 37.4° C., and the temperature of the rear surface may be 38.4° C. When the two cooling fans are used, the temperature of the front surface of the electronic device may further be reduced by 2.8° C. and the temperature of the rear surface may further be reduced by 2.3° C. in comparison to the case where one cooling fan is used.

For example, as illustrated in table 2, by cooling the electronic device 10 using the first cooling fan 250 and the second cooling fan 260, the wireless charging device 100 according to an embodiment can cool the electronic device 10 more effectively than the related-art wireless charging device using one cooling fan.

Figure 4A:
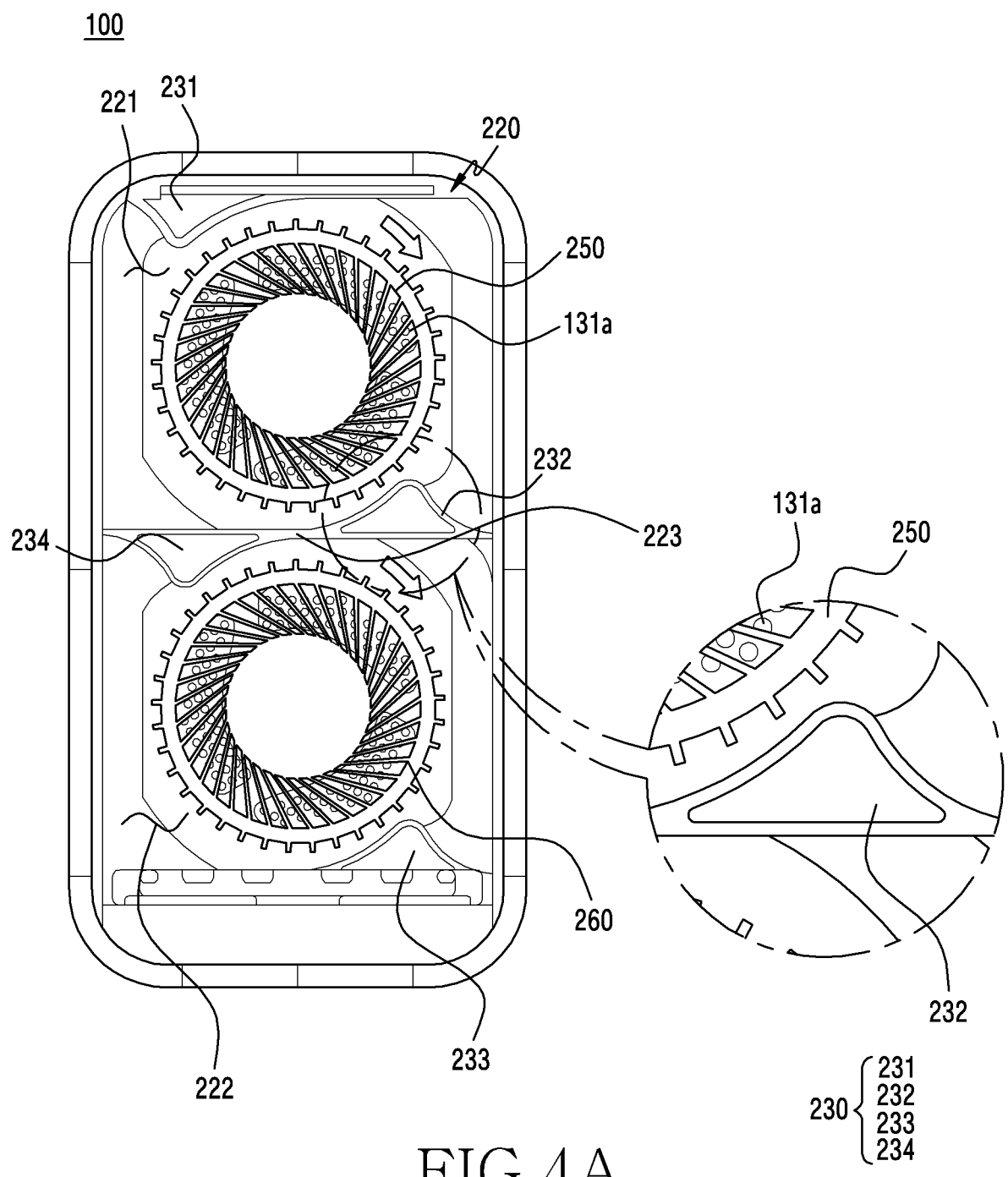
FIG. 4A is a diagram illustrating an inner structure of a holding portion of a wireless charging device according to various embodiments.
Figure 4B:
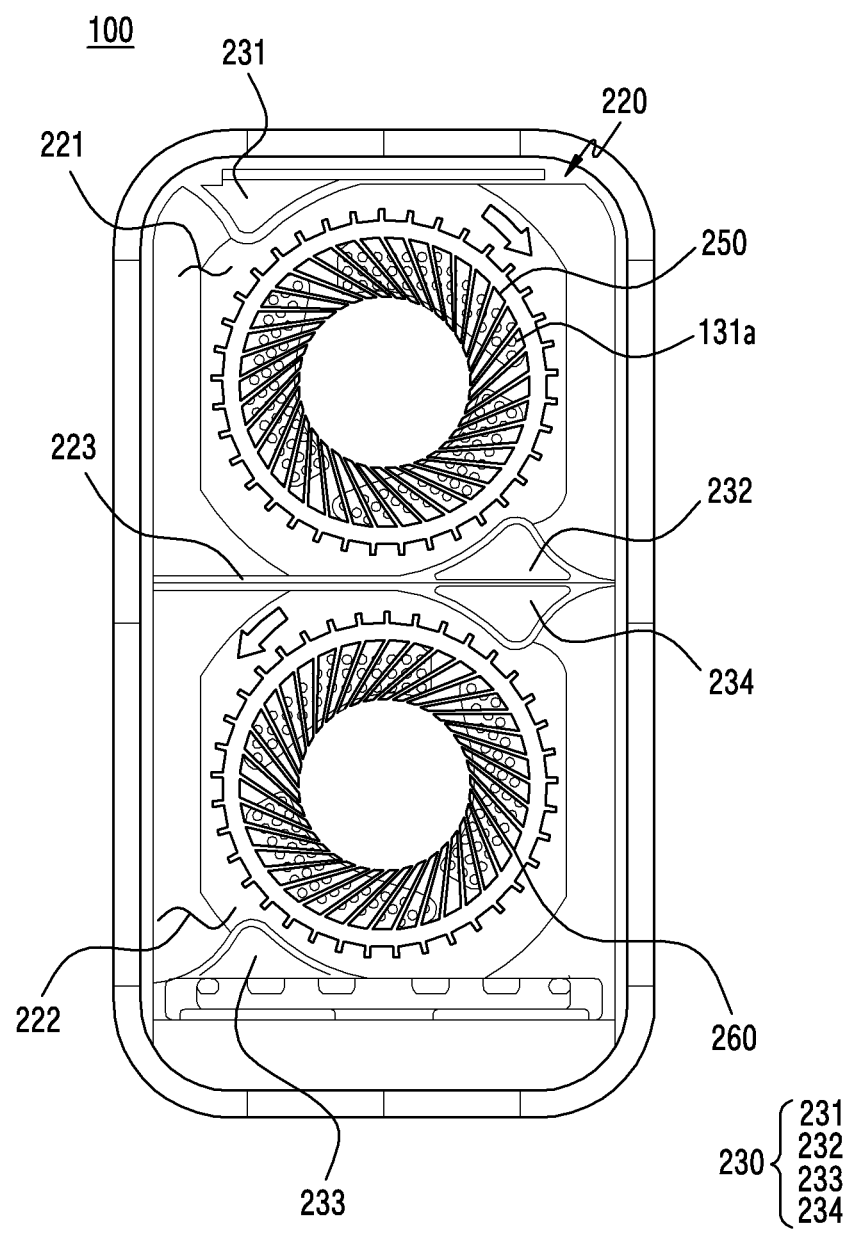
FIG. 4B is a diagram illustrating an inner structure of the holding portion of the wireless charging device according to various embodiments.
Figure 4C:
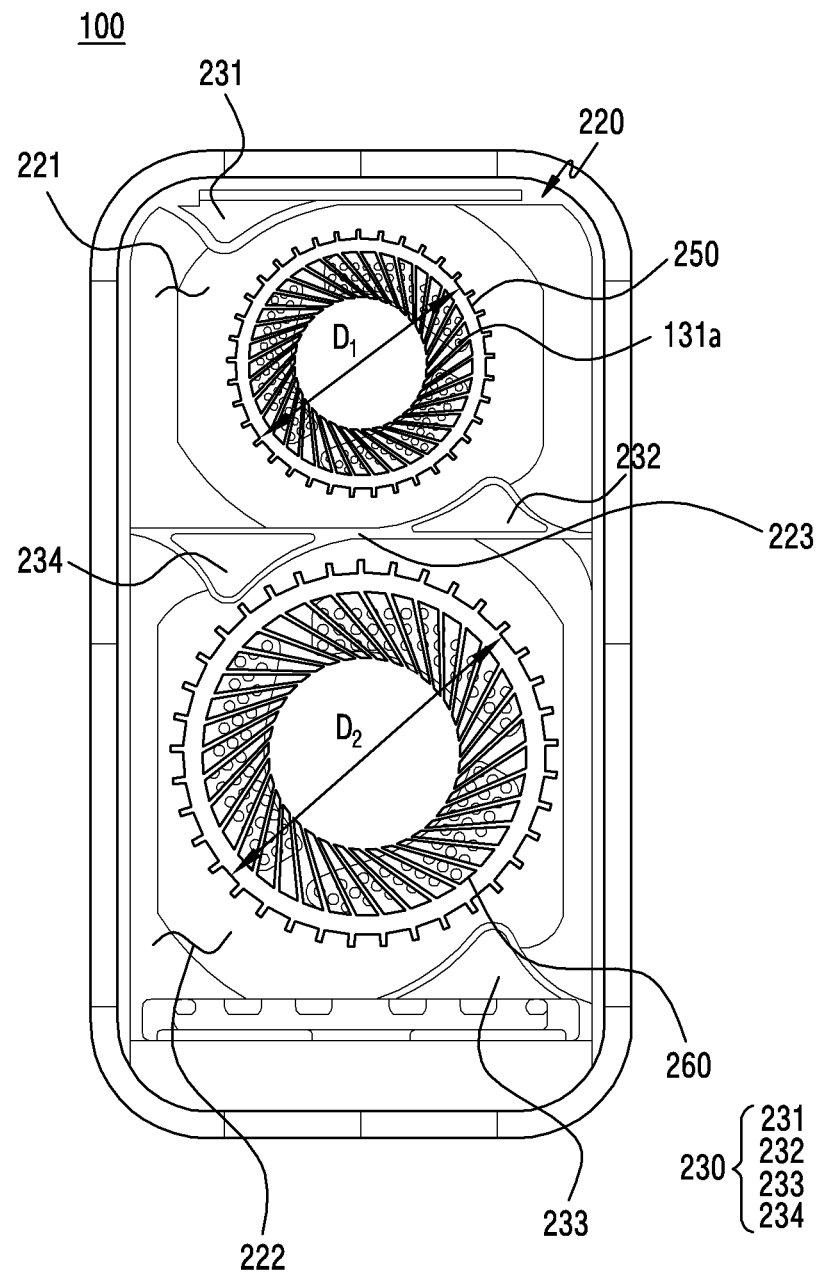
FIG. 4C is a diagram illustrating an inner structure of the holding portion of the wireless charging device according to various embodiments.

FIG. 4A is a diagram illustrating an example inner structure of a holding portion (for example, the holding portion 130 of FIG. 2) of a wireless charging device 100 (for example, the wireless charging device 100 of FIG. 2) according to various embodiments. FIG. 4B is a diagram illustrating an example inner structure of the holding portion of the wireless charging device according to various embodiments. FIG. 4C is a diagrams illustrating an example inner structure of the holding portion of the wireless charging device according to various embodiments.

Referring to FIGS. 4A, 4B, and 4C, the wireless charging device 100 according to an embodiment may include a second bracket 220 (for example, the second bracket 220 of FIG. 2) having a penetrating hole formed therein, a first cooling fan 250 (for example, the first cooling fan 250 of FIG. 2), and/or a second cooling fan 260 (for example, the second cooling fan 260) which is disposed in the penetrating hole of the second bracket 220. At least one of components of the wireless charging device 100 according to an embodiment may be the same as or similar to at least one of the components of the wireless charging device 100 of FIG. 2 and/or the wireless charging device 100 of FIGS. 3A and 3B, and a redundant explanation may not be repeated here.

The penetrating hole of the second bracket 220 may be divided into a first area 221 (for example, the first area 221 of FIG. 2) and a second area 222 (for example, the second area 222 of FIG. 2) by a partition 223 (for example, the partition 223 of FIGS. 2, 3A) formed in the penetrating hole.

According to an embodiment, the first cooling fan 250 may be disposed in the first area 221, and the second cooling fan 260 may be disposed in the second area 222. The first cooling fan 250 disposed in the first area 221 and the second cooling fan 260 disposed in the second area 222 may be isolated from each other by the partition 223.

The first cooling fan 250 and the second cooling fan 260 may be isolated from each other, such that external air cooled by the first cooling fan 250 can be prevented and/or reduced from flowing into the second area 222 where the second cooling fan 260 is disposed and influencing an external air process of the second cooling fan 260 (for example, generating turbulence). Similarly, external cooled by the second cooling fan 260 can be prevented and/or reduced from flowing into the first area 221 and influencing external air of the first cooling fan 250 through the partition 223.

For example, the wireless charging device 100 according to an embodiment can prevent and/or reduce air from flowing and influencing between the first cooling fan 250 and the second cooling fan 260 using the partition 223. As a result, the wireless charging device 100 according to an embodiment may operate one cooling fan (for example, the first cooling fan 250) of the first cooling fan 250 and the second cooling fan 260, and according to various embodiments (for example, FIG. 4B), the wireless charging device 100 may rotate the first cooling fan 250 and the second cooling fan 260 in different rotation directions.

According to an embodiment, at least one protrusion (for example, the protrusion 230 of FIG. 2) may be formed in the first area 221 and the second area 222 of the second bracket 220. The at least one protrusion 230 may include a first protrusion 231, a second protrusion 232, a third protrusion 233, and/or a fourth protrusion 234. At least a portion of the first protrusion 231 may protrude from one side of an upper end of the second bracket 220 toward the first area 221, and at least a portion of the second protrusion 232 may protrude from the partition 223 toward the first area 221. In addition, at least a portion of the third protrusion 233 may protrude from one side of a lower end of the second bracket 220 toward the second area 222, and at least a portion of the fourth protrusion 234 may protrude from the partition 223 toward the second area 222.

The first protrusion 231 and the second protrusion 232 formed in the first area 221 may be disposed on positions misaligned from each other, and the third protrusion 233 and the fourth protrusion 234 formed in the second area 222 may be disposed on positions misaligned from each other.

In an example (for example, FIG. 4A), the first protrusion 231 may protrude from an upper end area of the left of the second bracket 220 toward the first area 221, and the second protrusion 232 may protrude from a left area of the partition 223 toward the first area 221, such that the first protrusion 231 is positioned on an upper end area of the left of the first area 221 and the second protrusion 232 is positioned on a lower end area of the right of the first area 221.

In addition, the third protrusion 233 may protrude from a lower end of the right of the second bracket 220 toward the second area 222, and the fourth protrusion 234 may protrude from a left area of the partition 223 toward the second area 221, such that the third protrusion 232 is positioned on a lower end area of the right of the second area 221 and the fourth protrusion 234 is positioned on an upper end area of the left of the second area 221.

According to an embodiment, the first protrusion 231, the second protrusion 232, the third protrusion 233, and the fourth protrusion 234 may be formed in a volute shape. The Archimedean spiral is the trajectory drawn by one point on a plane when the point is away from a fixed point at a constant speed along a straight line rotating at a constant angular velocity, and the volute shape in the disclosure refers to a shape formed to correspond to the Archimedean spiral.

The first protrusion 231 and the second protrusion 232 disposed in the first area 221 in the volute shape can prevent and/or reduce air cooled by the first cooling fan 250 from being lost during an air flowing process. Similarly, the third protrusion 233 and the fourth protrusion 234 disposed in the second area 222 in the volute shape can prevent and/or reduce air cooled by the second cooling fan 260 from being lost during an air flowing process.

When there is no separate protrusion (for example, the first protrusion 231 and the second protrusion 232, or the third protrusion 233 and the fourth protrusion 234) in the first area 221 or the second area 222, a distance between the first cooling fan 250 and a periphery of the first area 221, or a distance between the second cooling fan 260 and a periphery of the second area 222 may not be uniformly maintained. Accordingly, an area in which cooled air flows may not be uniformly maintained, and a flow speed of cooled air may vary according to a position where the cooled air flows.

When the flow speed of the cooled air is changed according to a flow position, turbulence may be generated in a certain area of the first area 221 (for example, an upper periphery area of the first area 221) or a certain area of the second area 222 (for example, a lower periphery area of the second area 222) during the cooling process of the first cooling fan 250 and/or the second cooling fan 260, and a loss of flow of the cooled air may be caused by the generated turbulence and cooling efficiency may be reduced.

On the other hand, the wireless charging device 100 according to an embodiment may uniformly maintain an area where the cooled air flows (hereinafter, a "flow area") in the first area 221 and the second area 222 through the first protrusion 231, the second protrusion 232, the third protrusion 233, and/or the fourth protrusion 234, which is disposed in the first area 221 and the second area 222 in the volute shape. The wireless charging device 100 can constantly maintain the flow speed of the cooled air by uniformly maintaining the flow area of the cooed air, and, by doing so, the wireless charging device 100 can prevent and/or reduce turbulence from being generated in a certain area of the first area 221 or the second area 222. For example, the air cooled by the second cooling fan 260 may be guided according to the shape of the third protrusion 233 and/or the fourth protrusion 234, and may be made to flow in a predetermined direction in the air flowing process, so that a loss caused by air flowing in other directions can be reduced.

For example, the wireless charging device 100 according to an embodiment can prevent and/or reduce turbulence from being generated using at least one protrusion 230 of the volute shape, and as a result, can enhance cooling efficiency by preventing and/or reducing a loss of flow of cooled air.

In the wireless charging device 100 according to various embodiments, the first cooling fan 250 and the second cooling fan 260 are isolated from each other by the partition 223, such that the first cooling fan 250 and the second cooling fan 260 can be independently operated. For example, the wireless charging device 100 may rotate the first cooling fan 250 and the second cooling fan 260 in the same rotation, or may rotate the first cooling fan and the second cooling fan 260 in the opposite directions according to an embodiment.

According to various embodiments, the disposal positions of the first protrusion 231, the second protrusion 232, the third protrusion 233, and the fourth protrusion 234 may be changed according to rotation directions of the first cooling fan 250 and the second cooling fan 260.

According to an embodiment (for example, FIG. 4A), when the first cooling fan 250 and the second cooling fan 260 are rotated in the same direction (for example, the clockwise direction), the second protrusion 232 and the fourth protrusion 234 may be disposed on misaligned positioned with reference to the partition 223. For example, the second protrusion 232 may be disposed on a right area of the partition 223, and the fourth protrusion 234 may be disposed on a left area of the partition 223. When the second protrusion 232 is disposed on the right area of the partition 223 and the fourth protrusion 234 is disposed on the left area of the partition 223 as described above, the first protrusion 231 may be disposed on a left area of the upper end of the second bracket 220 and the third protrusion 233 may be disposed on a right area of the lower end of the second bracket 220. However, the positions where the second protrusion 232 and the fourth protrusion 234 are disposed are not limited to the embodiment illustrated in FIG. 4A, and according to an embodiment, the second protrusion 232 may be disposed on a left area of the partition 223 and the fourth protrusion 232 may be disposed on a right area of the partition 223.

According to an embodiment (for example, FIG. 4B), when the first cooling fan 250 and the second cooling fan 260 are rotated in the opposite directions, the second protrusion 232 and the fourth protrusion 234 may be disposed on positions facing each other with reference to the partition 223.

For example, the second protrusion 232 and the fourth protrusion 234 may be disposed on right areas of the partition 223, and in this case, the first protrusion 231 may be disposed on a left area of the upper end of the second bracket 220 and the third protrusion 233 may be disposed on a left area of the lower end of the second bracket 220. In another example, the second protrusion 232 and the fourth protrusion 234 may be disposed on right areas of the partition 223, and in this case, the first protrusion 231 may be disposed on a right area of the upper end of the second bracket 220 and the third protrusion 233 may be disposed on a right area of the lower end of the second bracket 220.

According to various embodiments, the first cooling fan 250 and the second cooling fan 260 of the wireless charging device 100 may be the same as each other, or the first cooling fan 250 and the second cooling fan 260 may have different diameters according to an embodiment (for example, FIG. 4C).

For example (for example, see FIG. 4C), the first cooling fan 250 may be a cooling fan that has a first diameter $D_1$, and the second cooling fan 260 may be a cooling fan that has a second diameter $D_2$ larger than the first diameter However, the diameters of the first cooling fan 250 and the second cooling fan 260 are not limited thereto. According to an embodiment (not shown), the diameter of the first cooling fan 250 may be larger than the diameter of the second cooling fan 260.

Figure 5:
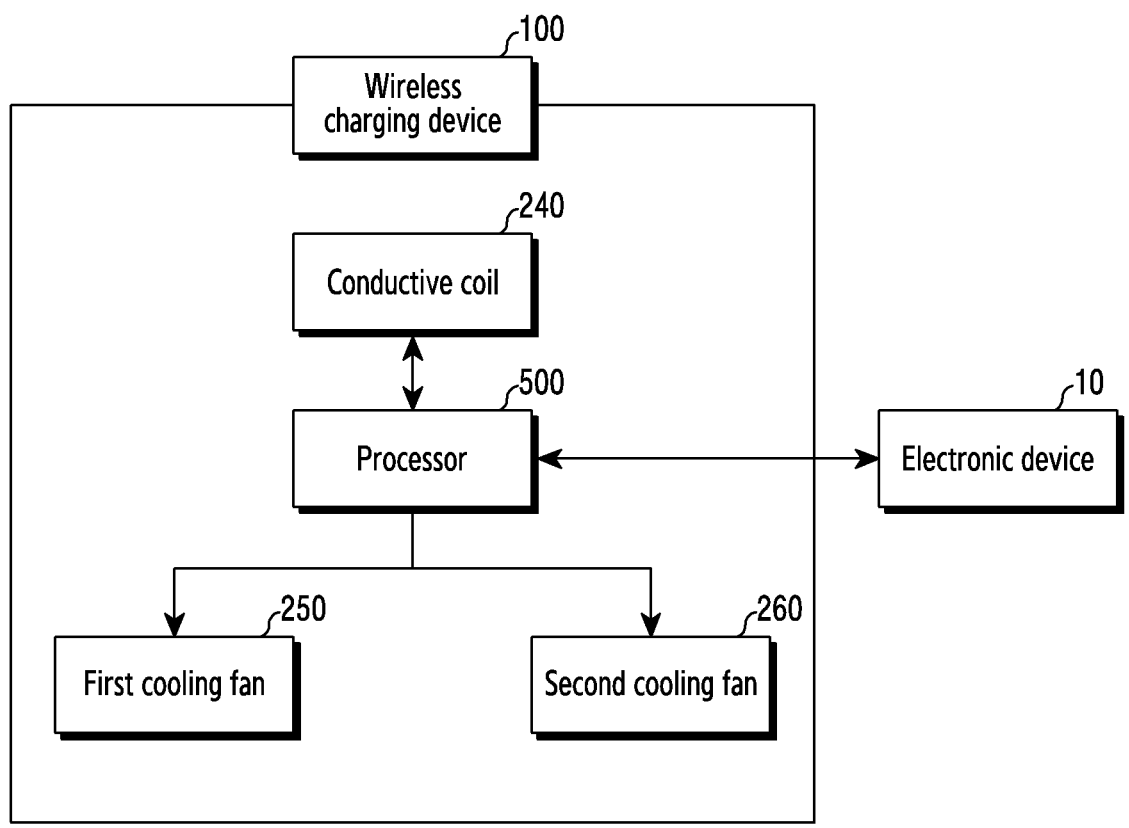
FIG. 5 is a block diagram illustrating an example connection relationship between components of a wireless charging device and an electronic device held on the wireless charging device according to various embodiments.

FIG. 5 is a block diagram illustrating an example connection relationship between components of a wireless charging device 100 and an electronic device 10 held on the wireless charging device 100 according to various embodiments.

Referring to FIG. 5, the wireless charging device 100 according to an embodiment may include a conductive coil 240, a first cooling fan 250, a second cooling fan 260, and a processor (e.g., including processing circuitry) 500. At least one of the components of the wireless charging device 100 according to an embodiment may be the same as or similar to at least one of the components of the wireless charging device 100 of FIGS. 2, 3A, 3B, 4A, 4B, and/or 4C, and a redundant explanation may not be repeated here.

According to an embodiment, the processor 500 may include various processing circuitry and be operatively connected with the conductive coil 240, the first cooling fan 250, and/or the second cooling fan 260.

For example, the processor 500 may be operatively connected with the conductive coil 240, such that the processor can supply power to the conductive coil 240 or can recognize a holding state (for example, a horizontal holding state, a vertical holding state) of the electronic device (for example, the electronic device 10 of FIGS. 1B, 1C) through the conductive coil 240.

In another example, the processor 500 may be operatively connected with the first cooling fan 250 and/or the second cooling fan 260, thereby controlling operations of the first cooling fan 250 and/or the second cooling fan 260. For example, the processor 500 may control activation (for example, on), inactivation (for example, off), a rotation speed, and/or a rotation direction (for example, rotation in the clockwise direction or the counter clockwise direction) of the first cooling fan 250 and/or the second cooling fan 260.

According to various embodiments, the processor 500 may receive device information (for example, information including a temperature, a current position of the electronic device 10, a current time, a charging mode, etc.) of the electronic device 10 from the electronic device 10 (for example, the electronic device 10 of FIG. 1B) held on the wireless charging device 100 through wireless communication (a wireless charging in-band communication unit or a short range communication unit such as, for example, and without limitation, Bluetooth (BT), Wi-Fi, near field communication (NFC), etc. (not shown)). The processor 500 may control the conductive coil 240, the first cooling fan 250, and/or the second cooling fan 260 based on the received device information, which will be described in detail below.

Figure 6:
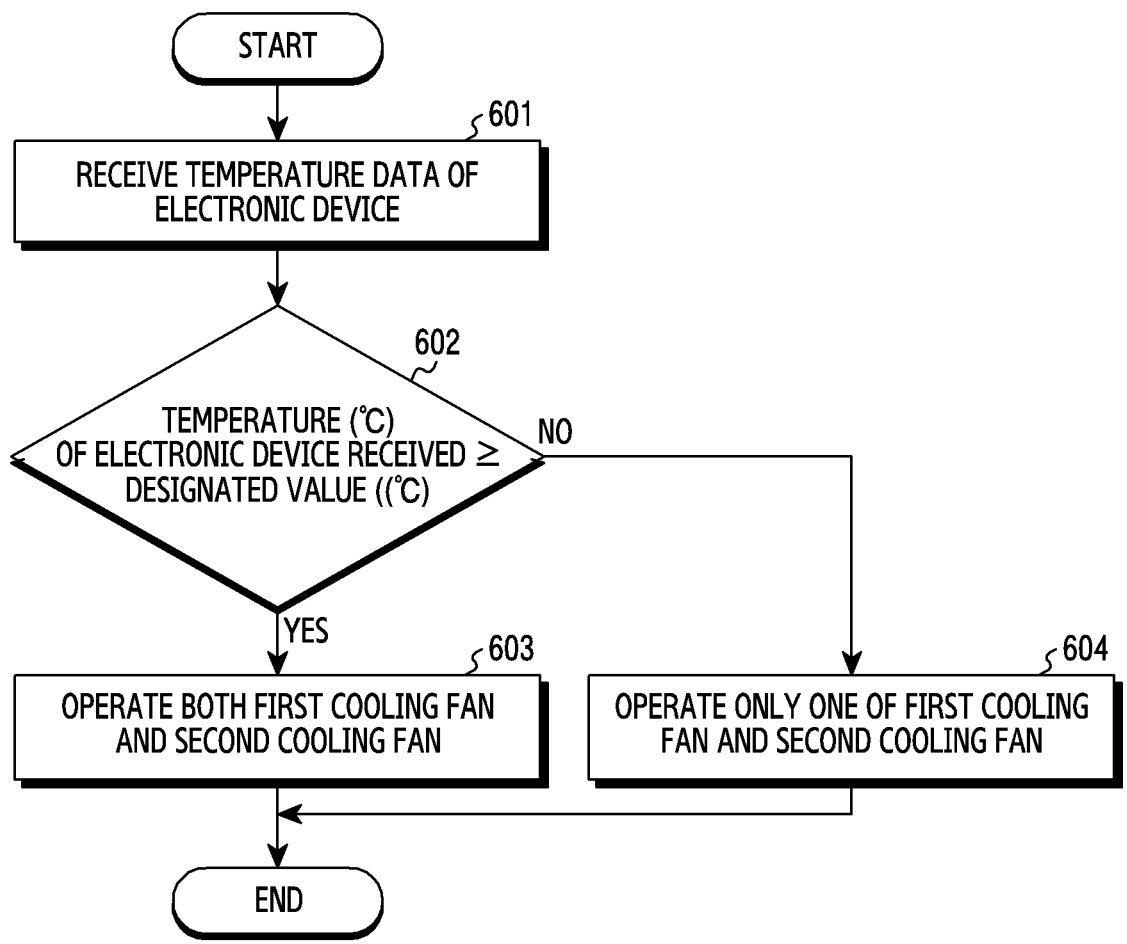
FIG. 6 is a flowchart illustrating an example operation of controlling an operation of a cooling fan, based on a temperature of an electronic device, in a wireless charging device according to various embodiments.

FIG. 6 is a flowchart illustrating an example operation of controlling an operation of a cooling fan (for example, the first cooling fan 250, the second cooling fan 260 of FIG. 5) based on a temperature of an electronic device (for example, the electronic device 10 of FIG. 5), in a wireless charging device (for example, the wireless charging device 100 of FIG. 5) according to various embodiments.

Referring to FIG. 6, in operation 601, a processor (for example, the processor 500 of FIG. 5) of the wireless charging device (for example, the wireless charging device 100 of FIG. 5) according to an embodiment may identify a change in temperature of the electronic device during a wireless charging process by receiving temperature data of the electronic device (for example, the electronic device 10 of FIGS. 1B, 1C) held on the wireless charging device.

For example, the processor may identify (e.g., determine) a temperature of the electronic device held on the wireless charging device by receiving temperature data of the electronic device from the electronic device.

According to an embodiment, the wireless charging device may include a temperature sensor (not shown) disposed on at least one surface of a holding portion (for example, the holding portion 130 of FIG. 1A) on which the electronic device is held. The processor may be operatively connected with the temperature sensor to receive temperature data of the electronic device held on the holding portion from the temperature sensor, and to identify a temperature of the electronic device held on the wireless charging device, based on the received temperature data.

According to an embodiment, the wireless charging device may include a wireless communication unit (not shown). The processor may be operatively connected with the wireless communication unit to receive a value of a temperature sensor of the electronic device held on the wireless charging device in a wireless charging in-band communication method or a short-range communication method.

In operation 602, the processor according to an embodiment may compare the temperature (e.g., ° C.) of the electronic device, received in operation 601, with a designated value (e.g., ° C.). When the temperature of the electronic device increases to a predetermined temperature or higher in the wireless charging process, wireless charging may be stopped to prevent and/or reduce a battery in the electronic device from being damaged.

The processor according to an embodiment may compare the temperature of the electronic device held and the designated value in operation 602, and may control operations of a first cooling fan (for example, the first cooling fan 250 of FIG. 2) or a second cooling fan (for example, the second cooling fan 260 of FIG. 2) according to a result of comparing, thereby preventing and/or reducing the temperature of the electronic device from increasing to a predetermined temperature or higher during the wireless charging process.

According to an embodiment, when it is determined that the temperature of the held electronic device is greater than or equal to the designated value in operation 602, the processor of the wireless charging device according to an embodiment may reduce the temperature of the electronic device by operating both the first cooling fan and the second cooling fan in operation 603.

The processor may operate both the first cooling fan and the second cooling fan according to a difference between the temperature of the electronic device and the designated value, and may increase or reduce a rotation speed of the first cooling fan and/or the second cooling fan. For example, when the temperature of the electronic device is a predetermined danger temperature (for example, a temperature enough to cause a serious damage to the electronic device), or the measured temperature does not decrease for a predetermined time, the processor may process cooling to be performed fast by increasing the rotation speed.

On the other hand, when it is determined that the temperature of the held electronic device is less than the designated value in operation 602, the processor of the wireless charging device according to an embodiment may operate only one of the first cooling fan and the second cooling fan in operation 604.

For example, when the temperature of the electronic device is high, the processor of the wireless charging device according to an embodiment may reduce the temperature of the electronic device by operating all of the first cooling fan and the second cooling fan, and, when the temperature of the electronic device is not high, the processor may operate one of the first cooling fan and the second cooling fan, thereby preventing and/or reducing unnecessary power consumption.

Figure 7:
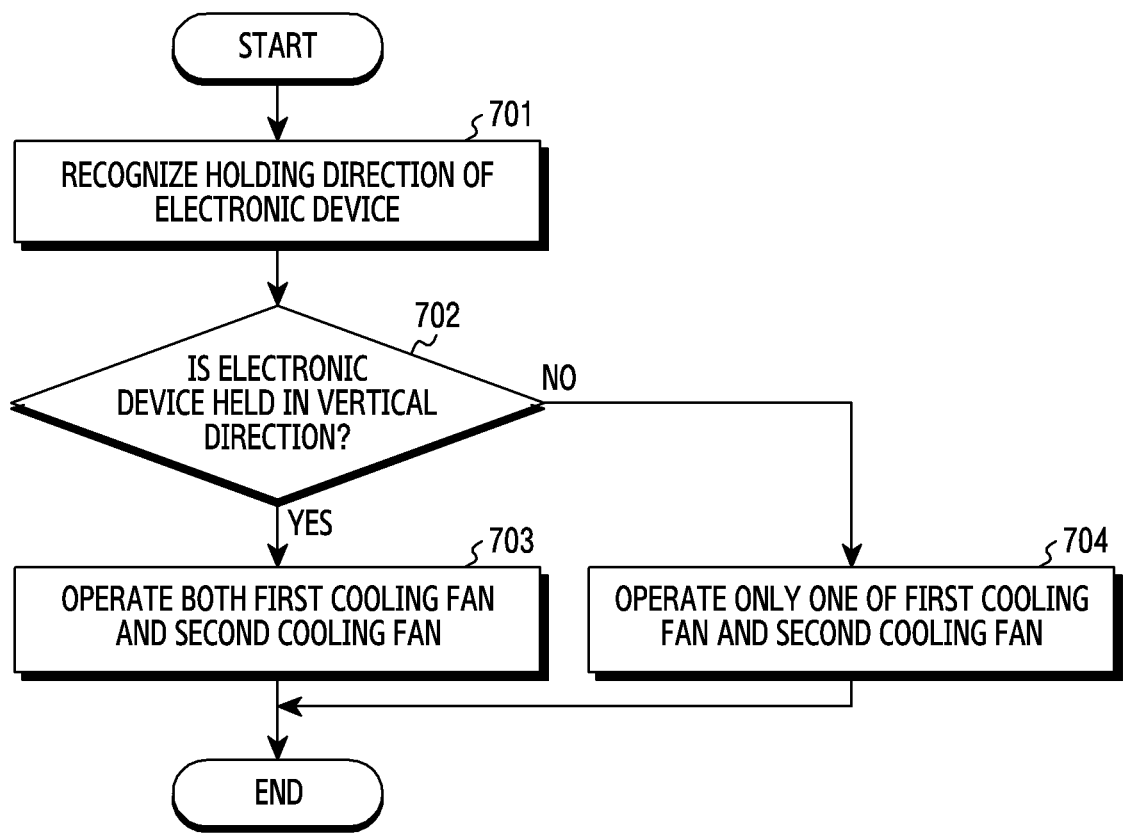
FIG. 7 is a flowchart illustrating an example operation of controlling an operation of a cooling fan, based on a holding state of an electronic device, in a wireless charging device according to various embodiments.

FIG. 7 is a flowchart illustrating an example operation of controlling an operation of a cooling fan, based on a holding state of an electronic device (for example, the electronic device 10 of FIG. 5), in a wireless charging device (for example, the wireless charging device 100 of FIG. 5) according to various embodiments.

Figure 8A:
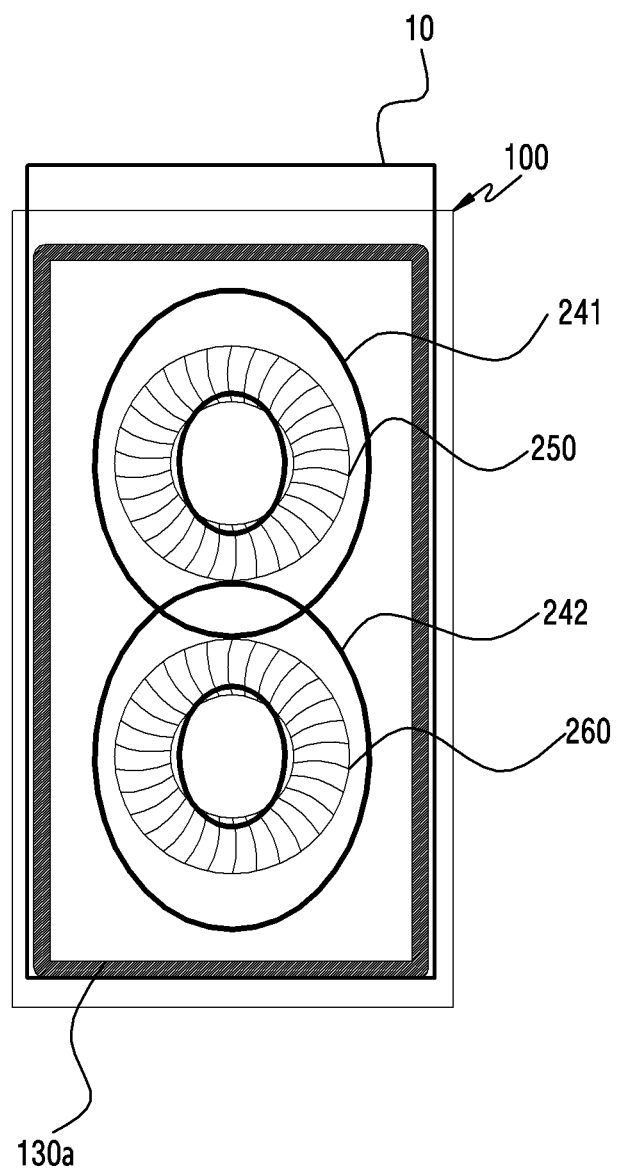
FIG. 8A is a diagram illustrating an example state in which an electronic device is held on a wireless charging device in a vertical direction according to various embodiments.
Figure 8B:
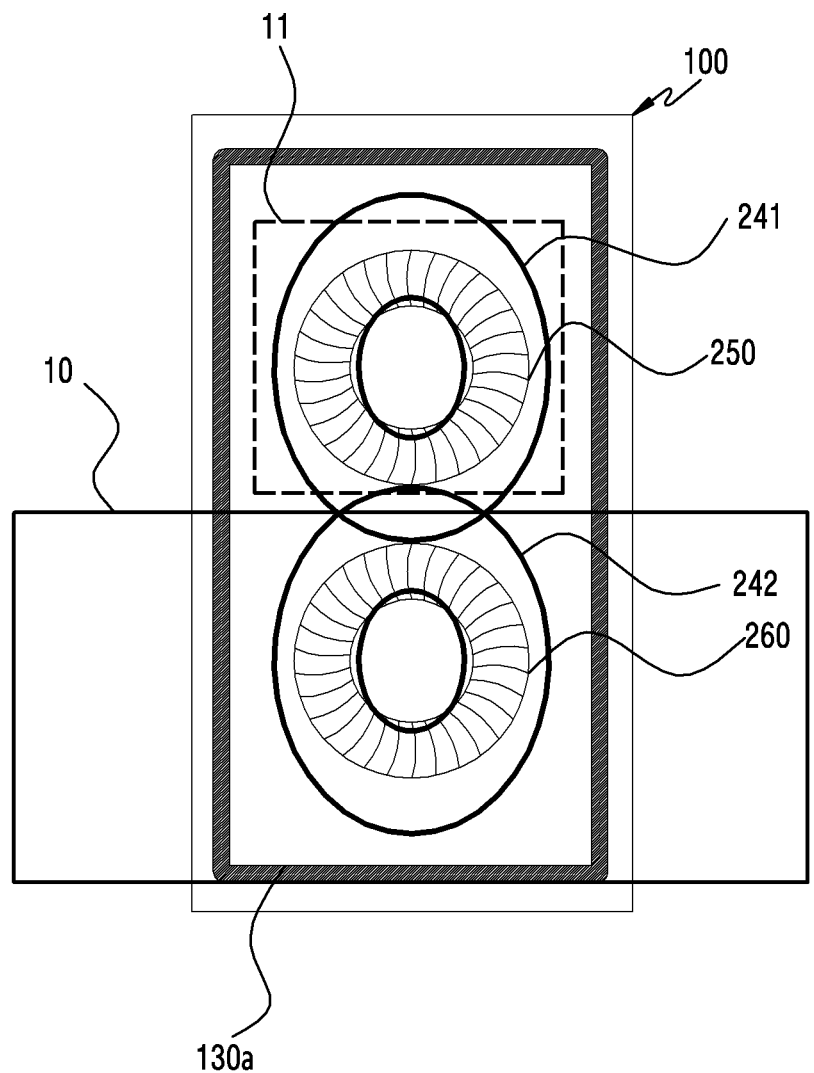
FIG. 8B is a diagram illustrating an example state in which the electronic device is held on the wireless charging device in a horizontal direction according to various embodiments.

FIG. 8A is a diagram illustrating an example state in which the electronic device 10 is held on the wireless charging device 100 in a vertical direction according to various embodiments. FIG. 8B is a diagram illustrating an example state in which the electronic device 10 is held on the wireless charging device 100 in a horizontal direction according to various embodiments.

Hereinafter, operation of controlling the operation of the cooling fan based on a holding state of the electronic device, shown in FIG. 7, will be described with reference to FIGS. 8A and 8B.

Referring to FIGS. 7, 8A, and 8B, in operation 701, a processor (for example, the processor 500 of FIG. 5) of the wireless charging device 100 (for example, the wireless charging device 100 of FIG. 5) according to an embodiment may recognize a holding direction of the electronic device 10 (for example, the electronic device 10 of FIG. 5) held on the wireless charging device 100.

When the electronic device 10 is held on the wireless charging device 100, magnetism and a signal may be generated in a conductive coil 241, 242. The processor may recognize whether the electronic device 10 is held and/or a holding state of the electronic device 10, based on the magnetism and the signal generated in the conductive coil 241, 242.

According to an embodiment, a first conductive coil 241 (for example, the first conductive coil 241 of FIG. 2), a second conductive coil 242 (for example, the second conductive coil 242 of FIG. 2) may be disposed in the wireless charging device 100.

When magnetism and a signal are generated in at least one conductive coil of the first conductive coil 241, the second conductive coil 242, the processor may recognize that the electronic device is held on the wireless charging device 100. In an embodiment (for example, FIG. 8A), when magnetism and a signal are generated in the first conductive coil 241 and the second conductive coil 242, the processor may recognize that the electronic device 10 is held in the vertical direction. According to an embodiment (for example, FIG. 8B), when magnetism and a signal are never generated or is almost not generated in the first conductive coil 241 and magnetism and a signal are generated in the second conductive coil 242, the processor may recognize that the electronic device 10 is held in the horizontal direction.

When it is recognized that the electronic device 10 is held in the vertical direction in operation 702, the processor according to an embodiment may operate both a first cooling fan 250 (for example, the first cooling fan 250 of FIG. 2) and a second cooling fan 260 (for example, the second cooling fan 260 of FIG. 2) in operation 703. Through operation 703, the processor can uniformly cool an upper end area (for example, an area corresponding to the first cooling fan 250) and a lower end area (for example, an area corresponding to the second cooling fan 260) of the electronic device 10 held on the wireless charging device 100.

On the other hand, when it is recognized that the electronic device 10 is held in the horizontal direction in operation 702, the processor according to an embodiment may operate only one of the first cooling fan 250 and the second cooling fan 260 in operation 704. For example, the processor may operate only the second cooling fan 260 disposed on the lower end area of the wireless charging device 100.

When the electronic device 10 is held on the wireless charging device 100 in the horizontal direction, the operation of the first cooling fan 250 disposed on the upper end area of the wireless charging device 100 is not required, and therefore, the processor can prevent and/or reduce unnecessary power consumption during the wireless charging process through operation 704.

Referring to FIG. 8B, according to an embodiment, a second electronic device 11 (for example, a wearable electronic device) may be additionally held on an upper end of the electronic device 10 with the electronic device 10 (for example, a portable electronic device) being held on the wireless charging device 100 in the horizontal direction.

The processor according to an embodiment may recognize that the second electronic device 11 is additionally held on the wireless charging device 100 in addition to the electronic device 10, based on magnetism generated in the first conductive coil 241 and/or the second conductive coil 242.

When it is recognized that the electronic device 10 and the second electronic device 11 are held on the wireless charging device 100 together, the processor may cool the electronic device 10 and the second electronic device 11, simultaneously, by operating both the first cooling fan 250 and the second cooling fan 260. According to various embodiments, the processor may differently set rotation speeds of the first cooling fan 250 and the second cooling fan 260 according to temperatures of the electronic device 10 and the second electronic device 11.

Figure 9:
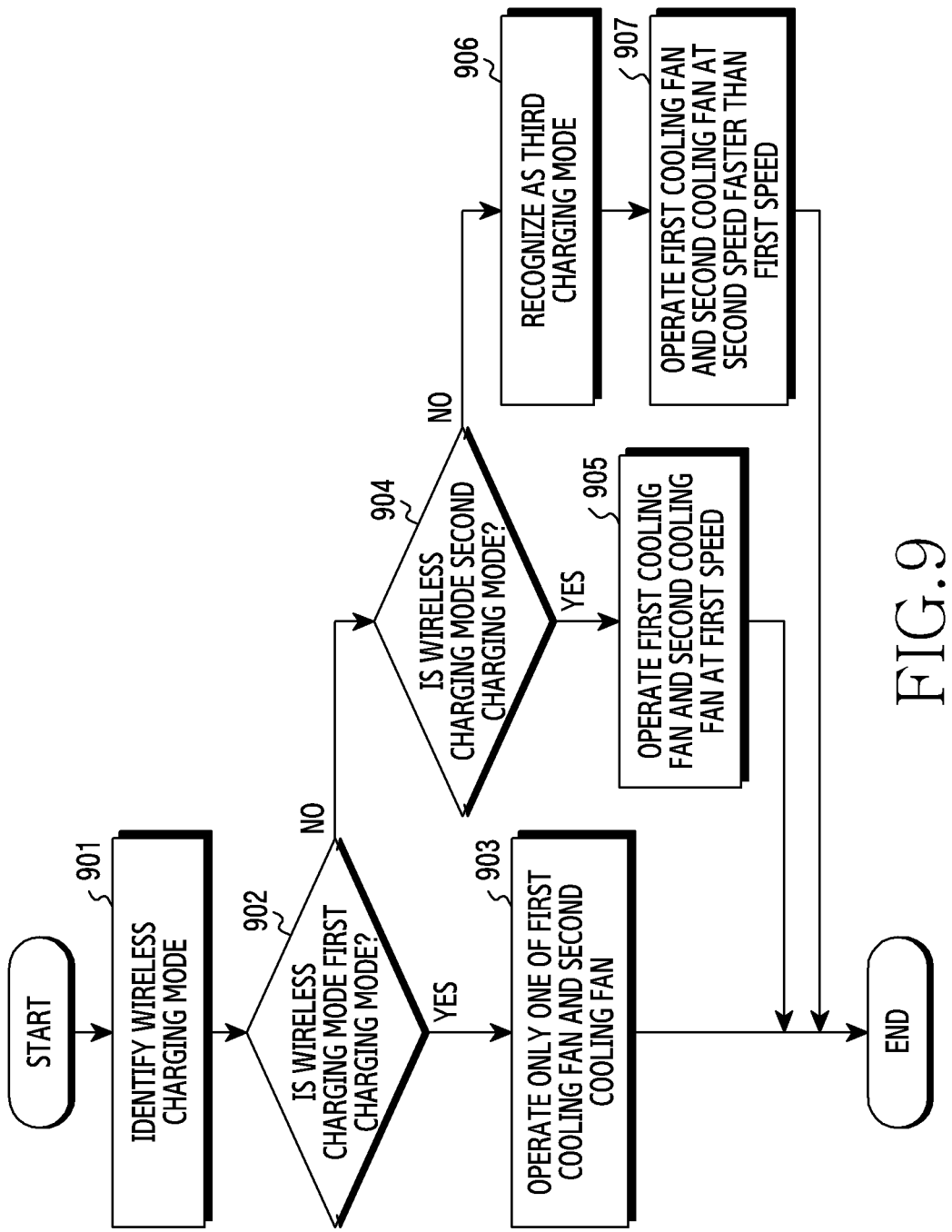
FIG. 9 is a flowchart illustrating an example operation of controlling an operation of a cooling fan according to a charging mode in a wireless charging device according to various embodiments.

FIG. 9 is a flowchart illustrating an example operation of controlling an operation of a cooling fan (for example, the first cooling fan 250, the second cooling fan 260 of FIG. 5) according to a charging mode in a wireless charging device (for example, the wireless charging device 100 of FIG. 5) according to various embodiments.

Referring to FIG. 9, in operation 901, a processor (for example, the processor 500 of FIG. 5) of the wireless charging device (for example, the wireless charging device 100 of FIG. 5) according to an embodiment may receive information on a wireless charging mode from an electronic device, and may identify a current wireless charging mode based on the received information.

According to an embodiment, the wireless charging mode may, for example, be classified into a first charging mode, a second charging mode in which charging is performed more quickly than in the first charging mode, and a third charging mode in which charging is performed more quickly than in the second charging mode, according to a wireless charging speed and/or power supplied through an external cable. Classifying the wireless charging mode is not limited to the above-described embodiment, and the wireless charging mode may be classified into a first charging mode, a second charging mode, a third charging mode, and an N-th charging mode (N is a natural number) according to an embodiment. In the following description, the wireless charging mode being classified into the first charging mode, the second charging mode, and the third charging mode will be mainly described.

In operation 902, the processor according to an embodiment may identify whether the current wireless charging mode of the wireless charging device identified in operation 901 is the first charging mode. When the first charging mode is identified in operation 901, the processor may operate only one of the first cooling fan and the second cooling fan through operation 903.

Since the first charging mode is a relatively low output charging mode, the temperature of the electronic device may not greatly increase when the electronic device is wirelessly charged in the first charging mode, and the processor can prevent and/or reduce unnecessary power consumption by operating only one cooling fan in the first charging mode.

When the current charging mode of the wireless charging device is not the first charging mode in operation 902, the processor according to an embodiment may identify whether the current wireless charging mode of the wireless charging device identified in operation 901 is the second charging mode through operation 904.

When the second charging mode is identified in operation 904, the processor may operate the first cooling fan and the second cooling fan together at a first speed through operation 905 since the temperature of the electronic device may be higher than in the first charging mode.

When the current charging mode of the wireless charging device is not the second charging mode in operation 904, the processor according to an embodiment may recognize that the current charging mode of the wireless charging device is the third charging mode in operation 906.

When the third charging mode is recognized in operation 906, the processor according to an embodiment may operate the first cooling fan and the second cooling fan together, and may increase rotation speeds of the first cooling fan and the second cooling fan through operation 907. For example, when the processor rotates the first cooling fan and the second cooling fan at a first rotation speed in operation 905, the processor may rotate the first cooling fan and the second cooling fan at a second rotation speed which is faster than the first rotation speed, in operation 907.

For example, the wireless charging device according to an embodiment can prevent and/or reduce the temperature of the electronic device from increasing to a predetermined temperature or higher during the wireless charging process, by adjusting the number of cooling fans operating or adjusting the rotation speed of the cooling fan according to output of wireless charging. As a result, the wireless charging device according to an embodiment can prevent and/or reduce wireless charging from being stopped due to an increase of the temperature of the electronic device.

Figure 10:
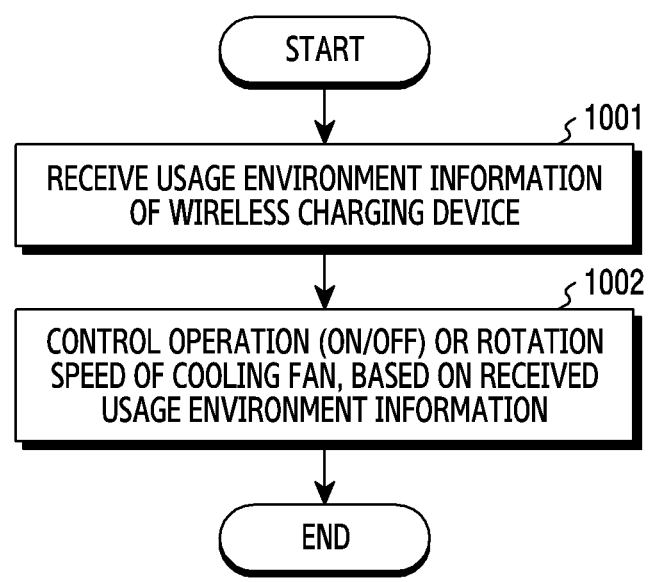
FIG. 10 is a flowchart illustrating an example operation of controlling an operation of a cooling fan, based on a usage environment, in a wireless charging device according to various embodiments.

FIG. 10 is a flowchart illustrating an example operation of controlling an operation of a cooling fan (for example, the first cooling fan 250, the second cooling fan 260 of FIG. 5), based on a usage environment, in a wireless charging device (for example, the wireless charging device 100 of FIG. 5) according to various embodiments.

Referring to FIG. 10, in operation 1001, a processor (for example, the processor 500) of the wireless charging device (for example, the wireless charging device 100 of FIG. 5) according to an embodiment may receive usage environment information of the wireless charging device from an electronic device (for example, the electronic device 10 of FIG. 5) held on the wireless charging device. The processor may receive usage environment information including a position, a time, or a place of the electronic device from the electronic device, and may control the wireless charging device based on the received usage environment information.

In operation 1002, the processor of the wireless charging device according to an embodiment may control operations of a first cooling fan (for example, the first cooling fan 250 of FIG. 2), a second cooling fan (for example, the second cooling fan 260 of FIG. 2), based on the usage environment information received in operation 1001. For example, the processor of the wireless charging device may adjust activation (for example, on), inactivation (for example, off), a rotation direction (for example, the clockwise direction or the counter clockwise direction), or a rotation speed of the first cooling fan and/or the second cooling fan.

For example, the processor may identify information on a current time from the usage environment information received in operation 1001, and, when the current time is a bedtime set by the user, the processor may not operate all of the first cooling fan and the second cooling fan, or may operate only one of the first cooling fan and the second cooling fan.

In another example, when the current time corresponds to the bedtime set by the user, the processor may reduce noise generation by reducing the rotation speed of the first cooling fan and/or the second cooling fan, while operating the first cooling fan and/or the second cooling fan.

According to an embodiment, the processor may identify current position information of the wireless charging device or the electronic device from the usage environment information received in operation 1001, and may control the operation of the first cooling fan and/or the second cooling fan, based on the identified position information of the wireless charging device or the electronic device.

For example, when it is determined that the position of the wireless charging device or the electronic device identified in operation 1001 is a normal place (for example, an office, a living room), the processor may operate the first cooling fan and the second cooling fan together, or may increase the rotation speed of the first cooling fan and/or the second cooling fan.

On the other hand, when the position of the wireless charging device or the electronic device identified through operation 1001 is a place set by the user (for example, a bedroom, a library, or a public place), the processor may minimize and/or reduce noise generation by operating only one of the first cooling fan and the second cooling fan, or by reducing the rotation speed of the first cooling fan and/or the second cooling fan. The processor may control the operation of the first cooling fan and/or the second cooling fan, or control the rotation speed, based on a temperature of the wireless charging device, although this is not illustrated.

For example, the wireless charging device according to an embodiment may control the operation of the cooling fan in response to an environment where wireless charging is performed (for example, a temperature of the wireless charging device, a wireless charging position), in addition to a temperature, a holding state of the electronic device held on the wireless charging device.

A wireless charging device (for example, the wireless charging device 100 of FIG. 2) according to various example embodiments may include: a housing (for example, the housing 110 of FIG. 1A) including a holding portion (for example, the holding portion 130 of FIG. 1A) configured to hold an external electronic device (for example, the electronic device 10 of FIGS. 1B, 1C) thereon; a first bracket (for example, the first bracket 210 of FIG. 2) positioned in the holding portion; a conductive coil (for example, the conductive coil 240 of FIG. 2) disposed in the first bracket; a second bracket (for example, the second bracket 220 of FIG. 2) positioned in the holding portion and including a penetrating hole; a first cooling fan (for example, the first cooling fan 250 of FIG. 2) positioned in the penetrating hole; a second cooling fan (for example, the second cooling fan 260 of FIG. 2) positioned in the penetrating hole and spaced apart from the first cooling fan; and a partition (for example, the partition 223 of FIG. 2) formed in the penetrating hole to isolate the first cooling fan and the second cooling fan from each other, the penetrating hole being divided into a first area (for example, the first area 221 of FIG. 2) to have the first cooling fan disposed therein and a second area (for example, the second area 222 of FIG. 2) to have the second cooling fan positioned therein, at least one protrusion having a volute shape (for example, the protrusion 230 of FIG. 2) formed on at least a portion of the second bracket or at least a portion of the partition, a first opening (for example, the air intake hole 210a of FIG. 3B) formed on at least an area of the first bracket to allow air cooled by the first cooling fan and/or the second cooling fan to move to the holding portion, and a second opening (for example, the air discharge hole 130a of FIGS. 2, 3B) formed on at least an area of the holding portion to allow the air transmitted from the first opening to move outside the wireless charging device.

According to an example embodiment, the protrusion may include: a first protrusion (for example, the first protrusion 231 of FIG. 4A) protruding from one side of an upper end of the second bracket toward the first area; a second protrusion (for example, the second protrusion 232 of FIG. 4A) protruding from the partition toward the first area, and at a position misaligned from the first protrusion; a third protrusion (for example, the third protrusion 233 of FIG. 4A) protruding from one side of a lower end of the second bracket toward the second area; and a fourth protrusion (for example, the fourth protrusion 234 of FIG. 4A) protruding from the partition toward the second area at a position misaligned from the third protrusion.

According to an example embodiment, the first opening may be formed along at least an area of a left periphery or a right periphery of the first bracket.

According to an example embodiment, the second opening may be formed along at least an area of a periphery of the holding portion.

According to an example embodiment (for example, see FIGS. 4A, 4B), the first cooling fan and the second cooling fan may have substantially a same diameter.

According to an example embodiment (for example, FIG. 4C), a diameter (for example, $D_1$ of FIG. 4C) of the first cooling fan and a diameter (for example, $D_2$ of FIG. 4C) of the second cooling fan may be different from each other.

According to an example embodiment (for example, see FIG. 4A), the first cooling fan and the second cooling fan may be rotated in a same direction.

According to an example embodiment, the second protrusion may be disposed at a position misaligned from the fourth protrusion with reference to the partition.

According to an example embodiment (for example, see FIG. 4B), the first cooling fan may be rotated in a direction opposite to a rotation direction of the second cooling fan.

According to an example embodiment, the second protrusion may be disposed at a position facing the fourth protrusion with reference to the partition.

A wireless charging device (for example, the wireless charging device 100 of FIG. 2) according to various example embodiments may include: a housing (for example, the housing 110 of FIG. 1A) including a holding portion (for example, the holding portion 130 of FIG. 1A) configured to hold an external electronic device (for example, the electronic device 10 of FIGS. 1B, 1C) thereon; a first bracket (for example, the first bracket 210 of FIG. 2) positioned in the holding portion; a conductive coil (for example, the conductive coil 240 of FIG. 2) disposed in the first bracket; a second bracket (for example, the second bracket 220 of FIG. 2) positioned in the holding portion and including a penetrating hole; a first cooling fan (for example, the first cooling fan 250 of FIG. 2) positioned in the penetrating hole; a second cooling fan (for example, the second cooling fan 260 of FIG. 2) positioned in the penetrating hole and spaced apart from the first cooling fan; a partition (for example, the partition 223 of FIG. 2) formed in the penetrating hole to isolate the first cooling fan and the second cooling fan from each other; and a processor (for example, the processor 500 of FIG. 5) configured to control an operation of the first cooling fan and/or the second cooling fan, the penetrating hole being divided into a first area (for example, the first area 221 of FIG. 2) having the first cooling fan disposed therein, and a second area (for example, the second area 222 of FIG. 2) having the second cooling fan positioned therein, at least one protrusion (for example, the protrusion 230 of FIG. 2) having a volute shape formed on at least a portion of the second bracket or at least a portion of the partition, a first opening (for example, the air intake hole 210a of FIG. 3B) formed on at least an area of the first bracket to allow air cooled by the first cooling fan and/or the second cooling fan to move to the holding portion under control of the processor, and a second opening (for example, the air discharge hole 130a of FIGS. 2, 3B) formed on at least an area of the holding portion to allow the air transmitted from the first opening to move outside the wireless charging device.

According to an example embodiment, the wireless charging device may further include a temperature sensor (not shown) disposed on one surface of the holding portion and configured to measure a temperature of the external electronic device on the holding portion.

According to an example embodiment, the processor may be configured to control the operation of the first cooling fan and/or the second cooling fan, based on at least one of the temperature of the external electronic device obtained using the temperature sensor and/or a holding state of the external electronic device.

According to an example embodiment, the processor may be configured to receive temperature data of the external electronic device from the temperature sensor or the external electronic device.

According to an example embodiment (for example, see FIG. 6), the processor may be configured to: based on the temperature data of the external electronic device received being greater than or equal to a designated value, operate the first cooling fan and the second cooling fan; and, based on the temperature data of the external electronic device received being less than the designated value, operate any one of the first cooling fan and the second cooling fan.

According to an example embodiment, the processor may be configured to recognize a direction in which the external electronic device is held on the holding portion through the conductive coil.

According to an example embodiment (for example, see FIG. 7), the processor may be configured to: based on recognizing that the external electronic device is held in a vertical direction (for example, the electronic device 10 of FIG. 1B), operate the first cooling fan and the second cooling fan; and, based on recognizing that the external electronic device is held in a horizontal direction (for example, the electronic device 10 of FIG. 1C), operate one of the first cooling fan and the second cooling fan.

According to an example embodiment (for example, see FIG. 9), the processor may be configured to: operate one of the first cooling fan and the second cooling fan in a first charging mode; operate the first cooling fan and the second cooling fan at a first speed in a second charging mode; and, operate the first cooling fan and the second cooling fan at a second speed greater than the first speed in a third charging mode.

According to an example embodiment (for example, see FIG. 10), the processor may be configured to control the operation or a rotation speed of the first cooling fan and the second cooling fan based on usage environment information of the wireless charging device.

According to an example embodiment, the usage environment information may include at least one of a temperature of the wireless charging device, a using time of the wireless charging device, a using place of the wireless charging device.

According to an example embodiment, a method for controlling a cooling fan in a wireless charging device (for example, the wireless charging device 100 of FIG. 2) may include: identifying an external electronic device (for example, the electronic device 10 of FIGS. 1B, 1c) functionally connected with the wireless charging device; receiving usage environment information of the wireless charging device from the external electronic device based on the identification; and controlling an operation of at least one of a first cooling fan (for example, the first cooling fan 250 of FIG. 2) and a second cooling fan (for example, the second cooling fan 260 of FIG. 2) disposed in the wireless charging device, based at least on the usage environment information.

According to an example embodiment, the usage environment information may include at least one of a direction (for example, a horizontal direction, a vertical direction), a position (for example, left, right, center, etc.), a place (for example, an office, a living room, a bedroom, a library, a public place, etc.), a temperature, a charging mode of an external electronic device (for example, the electronic device 10 of FIGS. 1B, 1C) functionally connected with the wireless charging device (for example, the wireless charging device 100 of FIG. 2), or information on a current time set in the external electronic device.

According to an example embodiment, the wireless charging device may further identify another usage environment information, and control based on another usage environment information.

According to an example embodiment, another usage environment information may include at least one of a direction (for example, a horizontal direction, a vertical direction), a position (for example, left, right, center, etc.), a place (for example, an office, a living room, a bedroom, a library, a public place, etc.), a temperature of the wireless charging device (for example, the wireless charging device of FIG. 12), a time during which the wireless charging device is used, or information on a current time set in the wireless charging device.

The wireless charging device and the method according to various embodiments can effectively cool a wirelessly charged electronic device by reducing a distance between a fan and an air discharge portion (for example, the air discharge hole), and reducing a loss of flow of cooled air discharged to the outside of the wireless charging device.

In addition, the wireless charging device according to various embodiments does not use a separate fan module, such that a diameter of a fan can be increased compared to a case where the fan module is used and cooling efficiency can be enhanced. Accordingly, the wireless charging device according to various embodiments can increase charging supply power and thus enables quick wireless charging.

In the above-described example embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and equivalents thereof.

What is claimed is:

1. A wireless charging device comprising:
   a housing comprising a holding portion configured to hold an external electronic device thereon;
   a first bracket positioned in the holding portion;
   a conductive coil disposed in the first bracket;
   a second bracket positioned in the holding portion and including a penetrating hole;
   a first cooling fan positioned in the penetrating hole;
   a second cooling fan positioned in the penetrating hole and spaced apart from the first cooling fan; and
   a partition formed in the penetrating hole to isolate the first cooling fan and the second cooling fan from each other,
   wherein the penetrating hole is divided into a first area having the first cooling fan disposed therein and a second area having the second cooling fan positioned therein,
   wherein at least one protrusion having a volute shape is formed on at least a portion of the second bracket or at least a portion of the partition,
   wherein a first opening is formed on at least an area of the first bracket to allow air cooled by the first cooling fan and/or the second cooling fan to move to the holding portion,
   wherein a second opening is formed on at least an area of the holding portion to allow the air transmitted from the first opening to move outside the wireless charging device.

2. The wireless charging device of claim 1, wherein the protrusion comprises:
   a first protrusion protruding from one side of an upper end of the second bracket toward the first area;
   a second protrusion protruding from the partition toward the first area, and formed at a position misaligned from the first protrusion;
   a third protrusion protruding from one side of a lower end of the second bracket toward the second area; and a fourth protrusion protruding from the partition toward the second area and formed at a position misaligned from the third protrusion.

3. The wireless charging device of claim 2, wherein the second protrusion is disposed at a position misaligned from the fourth protrusion with reference to the partition.

4. The wireless charging device of claim 2, wherein the second protrusion is disposed at a position facing the fourth protrusion with reference to the partition.

5. The wireless charging device of claim 1, wherein the first opening is formed along at least an area of a left periphery or a right periphery of the first bracket.

6. The wireless charging device of claim 1, wherein the second opening is formed along at least an area of a periphery of the holding portion.

7. The wireless charging device of claim 1, wherein the first cooling fan and the second cooling fan have substantially a same diameter.

8. The wireless charging device of claim 1, wherein a diameter of the first cooling fan and a diameter of the second cooling fan are different from each other.

9. The wireless charging device of claim 1, wherein the first cooling fan and the second cooling fan are configured to be rotated in a same direction.

10. The wireless charging device of claim 1, wherein the first cooling fan is configured to be rotated in a direction opposite to a direction of rotation of the second cooling fan.

11. A wireless charging device comprising:
a housing comprising a holding portion configured to hold an external electronic device thereon;
a first bracket positioned in the holding portion;
a conductive coil disposed in the first bracket;
a second bracket positioned in the holding portion and including a penetrating hole;
a first cooling fan positioned in the penetrating hole;
a second cooling fan positioned in the penetrating hole and spaced apart from the first cooling fan;
a partition formed in the penetrating hole to isolate the first cooling fan and the second cooling fan from each other; and
a processor configured to control an operation of the first cooling fan and/or the second cooling fan,
wherein the penetrating hole is divided into a first area having the first cooling fan disposed therein, and a second area having the second cooling fan positioned therein by the partition,
wherein at least one protrusion having a volute shape is formed on at least a portion of the second bracket or at least a portion of the partition,
wherein a first opening is formed on at least an area of the first bracket to allow air cooled by the first cooling fan and/or the second cooling fan to move to the holding portion under control of the processor,
wherein a second opening is formed on at least an area of the holding portion to allow the air transmitted from the first opening to move outside the wireless charging device.

12. The wireless charging device of claim 11, further comprising a temperature sensor disposed on one surface of the holding portion where the external electronic device is held and configured to measure a temperature of the external electronic device held on the holding portion.

13. The wireless charging device of claim 12, wherein the processor is configured to control the operation of the first cooling fan and/or the second cooling fan, based on at least one of the temperature of the external electronic device obtained using the temperature sensor or a holding state of the external electronic device.

14. The wireless charging device of claim 12, wherein the processor is configured to receive temperature data of the external electronic device from the temperature sensor or the external electronic device.

15. The wireless charging device of claim 14, wherein the processor is configured to:
based on the temperature data of the external electronic device received being greater than or equal to a designated value, operate the first cooling fan and the second cooling fan; and
based on the temperature data of the external electronic device received being less than the designated value, operate any one of the first cooling fan and the second cooling fan.

16. The wireless charging device of claim 11, wherein the processor is configured to identify a direction in which the external electronic device is held on the holding portion through the conductive coil.

17. The wireless charging device of claim 16, wherein the processor is configured to:
based on identifying that the external electronic device is held in a vertical direction, operate the first cooling fan and the second cooling fan; and
based on identifying that the external electronic device is held in a horizontal direction, operate only one of the first cooling fan and the second cooling fan.

18. The wireless charging device of claim 11, wherein the processor is configured to:
in a first charging mode, operate one of the first cooling fan and the second cooling fan;
in a second charging mode, operate the first cooling fan and the second cooling fan at a first speed; and
in a third charging mode, operate the first cooling fan and the second cooling fan at a second speed which is greater than the first speed.

19. The wireless charging device of claim 11, wherein the processor is configured to control an operation or a rotation speed of the first cooling fan and the second cooling fan based on usage environment information of the wireless charging device.

* * * * *